United States Patent
Otani et al.

(10) Patent No.: US 11,376,766 B2
(45) Date of Patent: Jul. 5, 2022

(54) PATTERN FORMING METHOD

(71) Applicant: CANON KABUSHIKI KAISHA, Tokyo (JP)

(72) Inventors: Tomonori Otani, Iruma (JP); Toshiki Ito, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 332 days.

(21) Appl. No.: 16/523,067

(22) Filed: Jul. 26, 2019

(65) Prior Publication Data

US 2020/0047377 A1    Feb. 13, 2020

(30) Foreign Application Priority Data

Aug. 9, 2018  (JP) .............................. JP2018-150192

(51) Int. Cl.
    *B29C 35/08* (2006.01)
    *B29C 59/02* (2006.01)

(52) U.S. Cl.
    CPC ........ *B29C 35/0805* (2013.01); *B29C 59/026* (2013.01)

(58) Field of Classification Search
    CPC ............... G03F 7/70533; B29C 59/026; B29C 35/0805; B29C 2059/023
    See application file for complete search history.

(56) References Cited

U.S. PATENT DOCUMENTS

| 8,133,427 B2* | 3/2012 | Tada ..................... G03F 7/0002 |
| | | 264/494 |
| 8,142,850 B2 | 3/2012 | Sreenivasan et al. |
| 9,039,402 B2* | 5/2015 | Kawakami ............ B82Y 10/00 |
| | | 264/293 |

(Continued)

FOREIGN PATENT DOCUMENTS

| JP | 2009532906 A | 9/2009 |
| WO | 2007120537 A2 | 10/2007 |

OTHER PUBLICATIONS

English translation of IMAISHI. "Fundamental of the Marangoni Convection" Int. J. Microgravity Sci. 2014: S5-S12. No. 31 Supplement 2014, previously cited in IDS filed Jul. 26, 2019.

(Continued)

*Primary Examiner* — Matthew J Daniels
*Assistant Examiner* — Hana C Page
(74) *Attorney, Agent, or Firm* — Rossi, Kimms & McDowell LLP

(57) ABSTRACT

Pattern forming method includes, for each shot area group (SAG) in the following order: discretely dropping curable composition droplets to layer the droplets on a plurality of shot areas included in a certain SAG on substrate; waiting for a time of $(m_{max}-m) \times Td$, where Td is a time for the dropping on one shot area, m is the number of shot areas included in the certain SAG, and $m_{max}$ is the maximum value of m; and imprinting in order that the dropping is performed on the plurality of shot areas. The time Td and a time Ti for (Continued)

the imprinting on one shot area are equal to each other. The number of shot areas included in at least one SAG is different from the number of shot areas included in another at least one SAG. In the waiting, the dropping and the imprinting are not performed.

24 Claims, 20 Drawing Sheets

(56) References Cited

U.S. PATENT DOCUMENTS

2010/0072653 A1\* 3/2010 Kawakami .............. B29C 43/14
                                                                                   264/134

OTHER PUBLICATIONS

Reddy et al. "Simulation of fluid flow in the step and flash imprint lithography process" Microelectronic Engineering. 2005: 60-70. vol. 82. Cited in the specification.

Imaishi. "Fundamental of the Marangoni Convection" Int J. Microgravity Sci. 2014: S5-S12. No. 31 Supplement 2014 Cited in the specification.

\* cited by examiner

LAYERING STEP (1) ONTO SHOT AREA GROUP 1 ($m_1 = 4$): REQUIRED TIME ($m_1 \times Td$) = 4Td WAITING STEP (M): REQUIRED TIME ($Td \times (m_{max} - m_1)$) = 2Td IMPRINTING STEP (Im) ONTO SHOT AREA GROUP 1 ($m_1 = 4$): REQUIRED TIME ($m_1 \times Ti$) = 4Ti LAYERING STEP (1) ONTO SHOT AREA GROUP 3 ($m_3 = 5$): REQUIRED TIME ($m_3 \times T_d$) = $5T_d$ WAITING STEP (M): REQUIRED TIME ($T_d \times (m_{max} - m_3)$) = $T_d$ IMPRINTING STEP (Im) ONTO SHOT AREA GROUP 3 ($m_3 = 5$): REQUIRED TIME ($m_3 \times T_i$) = $5T_i$

FIG. 9A

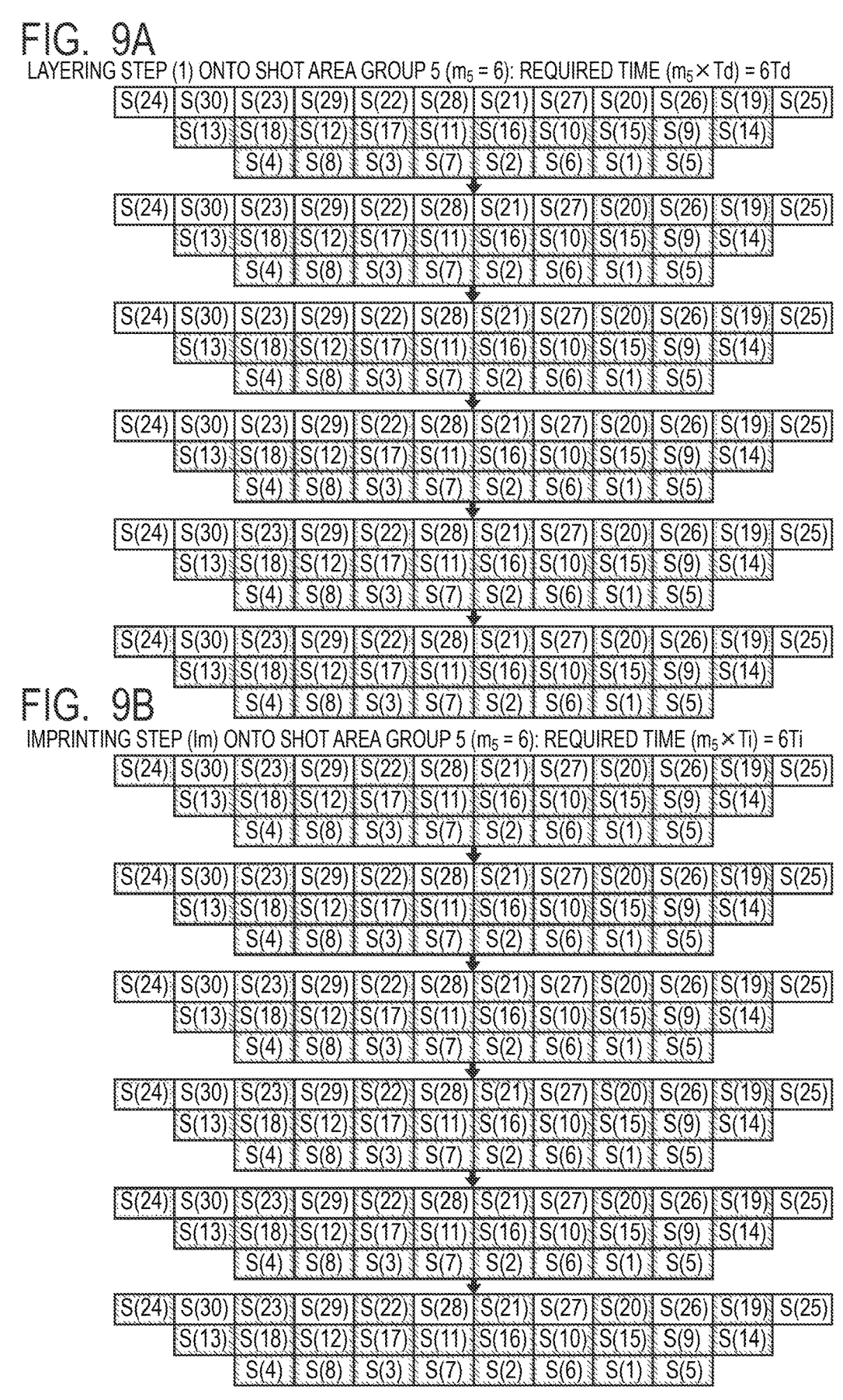

LAYERING STEP (1) ONTO SHOT AREA GROUP 5 ($m_5 = 6$): REQUIRED TIME ($m_5 \times Td$) = 6Td

FIG. 9B

IMPRINTING STEP (Im) ONTO SHOT AREA GROUP 5 ($m_5 = 6$): REQUIRED TIME ($m_5 \times Ti$) = 6Ti

FIG. 10A

LAYERING STEP (1) ONTO SHOT AREA GROUP 1 ($m_1 = 4$): REQUIRED TIME ($m_1 \times Td$) = $4Td$

FIG. 10B

WAITING STEP (M): REQUIRED TIME ($Td \times (m_{max} - m_1)$) = $2Td$

FIG. 10C

WAITING STEP (M): REQUIRED TIME ($m_{max} \times Ti$) = $6Ti$

LAYERING STEP (1) ONTO SHOT AREA GROUP 2 ($m_2 = 4$): REQUIRED TIME ($m_2 \times Td$) = 4Td WAITING STEP (M): REQUIRED TIME ($Td \times (m_{max} - m_2)$) = 2Td IMPRINTING STEP (Im) ONTO SHOT AREA GROUP 1 ($m_1 = 4$): REQUIRED TIME ($m_1 \times Ti$) = 4Ti WAITING STEP (M): REQUIRED TIME ($Ti \times (m_{max} - m_1)$) = 2Ti LAYERING STEP (1) ONTO SHOT AREA GROUP 3 ($m_3$ = 5): REQUIRED TIME ($m_3 \times Td$) = 5Td WAITING STEP (M): REQUIRED TIME ($Td \times (m_{max} - m_3)$) = Td IMPRINTING STEP (Im) ONTO SHOT AREA GROUP 2 ($m_2$ = 4): REQUIRED TIME ($m_2 \times Ti$) = 4Ti WAITING STEP (M): REQUIRED TIME ($Ti \times (m_{max} - m_2)$) = 2Ti

FIG. 13A
LAYERING STEP (1) ONTO SHOT AREA GROUP 4 ($m_4 = 5$): REQUIRED TIME ($m_4 \times Td$) = 5Td
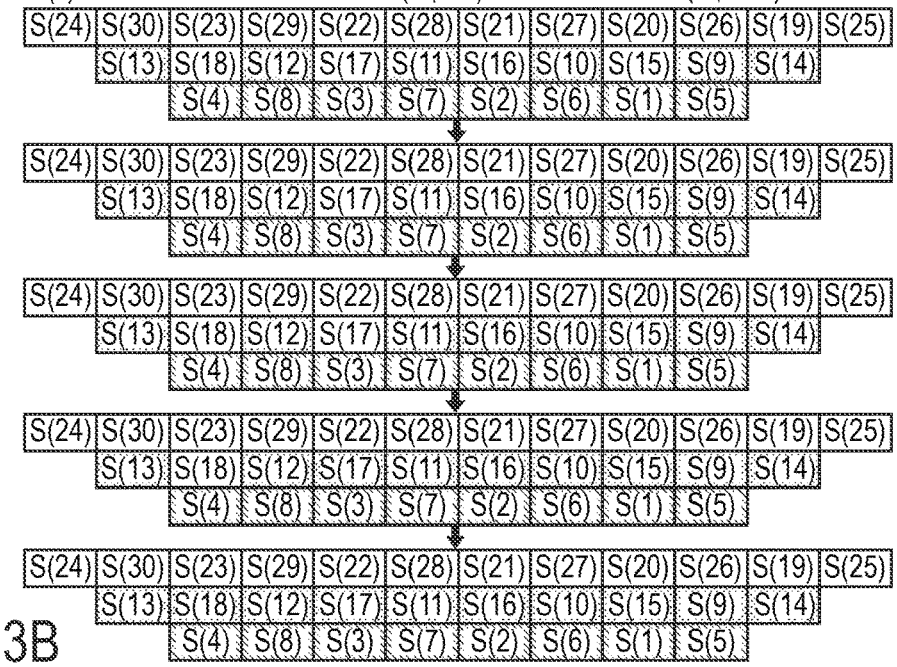
FIG. 13B
WAITING STEP (M): REQUIRED TIME ($Td \times (m_{max} - m_4)$) = Td
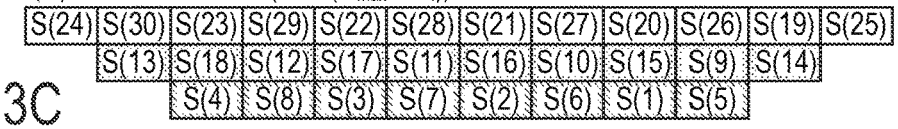
FIG. 13C
IMPRINTING STEP (Im) ONTO SHOT AREA GROUP 3 ($m_3 = 5$): REQUIRED TIME ($m_3 \times Ti$) = 5Ti
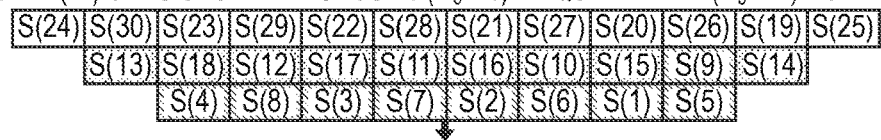
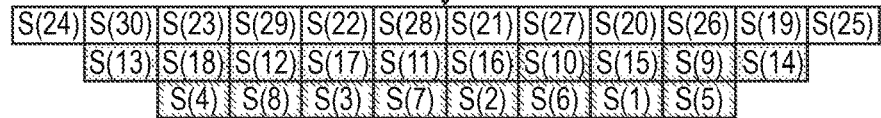
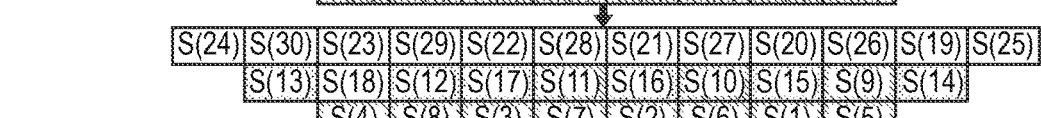
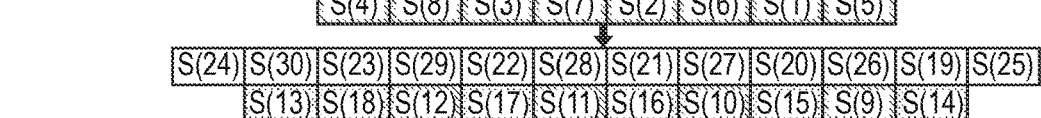
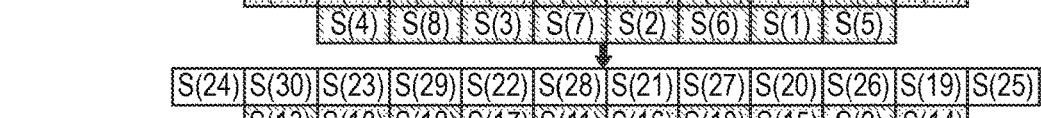
FIG. 13D
WAITING STEP (M): REQUIRED TIME ($Ti \times (m_{max} - m_3)$) = Ti
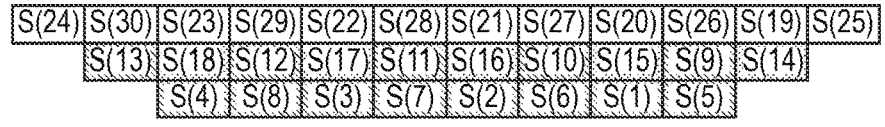

LAYERING STEP (1) ONTO SHOT AREA GROUP 5 ($m_5 = 6$): REQUIRED TIME ($m_5 \times Td$) = 6Td IMPRINTING STEP (Im) ONTO SHOT AREA GROUP 4 ($m_4 = 5$): REQUIRED TIME ($m_4 \times Ti$) = 5Ti WAITING STEP (M): REQUIRED TIME ($Ti \times (m_{max} - m_4)$) = Ti LAYERING STEP (1) ONTO SHOT AREA GROUP 6 ($m_6 = 6$): REQUIRED TIME ($m_6 \times Td$) = 6Td IMPRINTING STEP (Im) ONTO SHOT AREA GROUP 5 ($m_5 = 6$): REQUIRED TIME ($m_5 \times Ti$) = 6Ti WAITING STEP (M): REQUIRED TIME $(m_{max} \times Td) = 6Td$ IMPRINTING STEP (Im) ONTO SHOT AREA GROUP 6 $(m_6 = 6)$: REQUIRED TIME $(m_6 \times Ti) = 6Ti$

PATTERN FORMING METHOD

BACKGROUND OF THE INVENTION

Field of the Invention

The present invention relates to a pattern forming method, a method of manufacturing a semiconductor element, a method of manufacturing an electronic device and a method of manufacturing an optical component.

Description of the Related Art

Among microfabrication techniques used to manufacture semiconductor devices, MEMS and the like, a photo-nanoimprint technology has been attracting attention.

A pattern forming method used in the photo-nanoimprint technology includes a layering step (1) of dropping a liquid resist on a substrate, a mold contacting step (2) of bringing a mold into contact with the substrate on which the resist is dropped, a light irradiation step (3) of irradiating the substrate brought into contact with the mold with irradiation light, and a releasing step (4) of separating the mold from the substrate.

At this time, a phenomenon, so-called prespread, occurs in which droplets of the dropped resist spread on the substrate from the completion of the layering step (1) to the start of the mold contacting step (2).

In a case where there are a plurality of areas in contact with the mold on the substrate, the layering step (1) is sequentially performed on the plurality of areas such that the resist is prespread therebetween, and thus the required time for the spreading of the resist in the gap between the substrate and the mold in the mold contacting step (2) can be shortened.

Japanese Patent Application Laid-open No. 2009-532906 discloses a pattern forming method in which a mold is sequentially brought into contact with a polymer material distributed in a plurality of areas on a substrate after the polymer material is sequentially distributed in the plurality of areas.

In mass production of semiconductor devices, MEMS and the like, it is desired to achieve higher throughput of microfabrication techniques used for manufacturing.

In view of the above, an object of the present invention is to provide a pattern forming method which achieves higher throughput.

SUMMARY OF THE INVENTION

A pattern forming method according to the present invention is a method of forming a pattern in a plurality of shot areas included in a plurality of shot area groups on a substrate. The method includes, for each shot area group in the following order, discretely dropping droplets of a curable composition (A1) containing at least a component (a1) serving as a polymerizable compound to layer the droplets on a plurality of shot areas included in a certain shot area group on the substrate; waiting for a time of $(m_{max}-m) \times Td$, where Td is a time for the dropping on one shot area, m is the number of shot areas included in the certain shot area group, and $m_{max}$ is the maximum value of the number of shot areas included in each shot area group; in an order in which the dropping is performed on the plurality of shot areas, imprinting which includes bringing the curable composition (A1) into contact with a mold, irradiating the curable composition (A1) with light from a side of the mold to cure the curable composition (A1), and separating the mold from the cured product of the curable composition (A1), wherein the time Td and a time Ti for the imprinting on one shot area are equal to each other, the number of shot areas included in at least one shot area group is different from the number of shot areas included in another at least one shot area group, and in the waiting, the dropping and the imprinting are not performed.

Further features of the present invention will become apparent from the following description of exemplary embodiments with reference to the attached drawings.

BRIEF DESCRIPTION OF THE DRAWINGS

FIGS. 9A and 9B are schematic views illustrating steps of the pattern forming method according to the first embodiment.

FIGS. 10A, 10B, and 10C are schematic views illustrating steps of the pattern forming method according to the second embodiment.

FIGS. 13A, 13B, 13C, and 13D are schematic views illustrating steps of the pattern forming method according to the second embodiment.

FIG. 18 is a layout view of shot areas on a substrate used in Example 1.

FIG. 19 is a layout view of shot areas on a substrate used in Example 2.

FIG. 20 is a layout view of shot areas on a substrate used in Example 3.

DESCRIPTION OF THE EMBODIMENTS

Figure 1A:
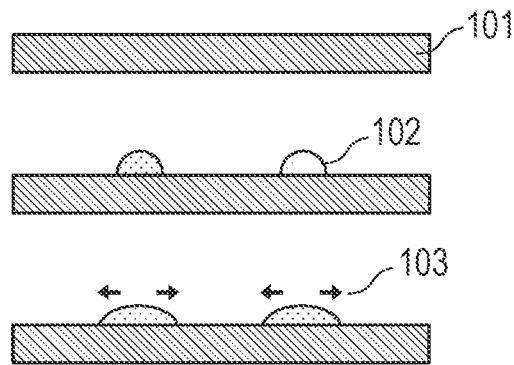
FIGS. 1A, 1B, 1C, and 1D are schematic cross-sectional views illustrating steps of a pattern forming method according to the present embodiment.

Preferred embodiments of the present invention will now be described in detail in accordance with the accompanying drawings.

Hereinafter, a pattern forming method according to the present embodiment will be described in detail based on accompanying drawings. Note that drawings described below are drawn at a scale different from actual ones in order to facilitate understanding of the present embodiment.

First, a curable composition (A1) used in the pattern forming method according to the present embodiment is described.

[Curable Composition (A1)]

The curable composition (A1) according to the present embodiment is a compound containing at least a component (a1) serving as a polymerizable compound. The curable composition (A1) according to the present embodiment may further contain a component (b1) serving as a photopolymerization initiator, a compound (c1) serving as a non-polymerizable compound or a component (d1) serving as a solvent.

In addition, the term "cured film" as used herein means a film obtained by polymerizing and curing the curable composition (A1) on a substrate. The shape of the cured film is not particularly limited, and the film may have a pattern shape on its surface.

Each component is hereinafter described in detail.

<Component (a1): Polymerizable Compound>

The component (a1) serving as a polymerizable compound as used herein is a compound that reacts with a polymeric element (such as a radical) generated from the component (b1) serving as a photopolymerization initiator to form a film formed of a polymer compound by a chain reaction (polymerization reaction).

Examples of such a polymerizable compound include a radical polymerizable compound. The component (a1) serving as a polymerizable compound may be formed of only one polymerizable compound or a plurality of polymerizable compounds.

It is preferred that the radical polymerizable compound be a compound having one or more acryloyl groups or methacryloyl groups, that is, a (meth)acrylic compound. Therefore, it is preferred that the curable composition (A1) according to the present embodiment contain the (meth)acrylic compound as the component (a1), and it is more preferred that a main component for the component (a1) be the (meth)acrylic compound. It is most preferred that the component (a1) be the (meth)acrylic compound. The phrase "a main component for the component (a1) is the (meth)acrylic compound" described herein means that the (meth)acrylic compound accounts for 90 wt % or more of the component (a1).

When the radical polymerizable compound includes a plurality of compounds each having one or more acryloyl groups or methacryloyl groups, the compound preferably contains a monofunctional (meth)acrylic monomer and a polyfunctional (meth)acrylic monomer. This is because the combination of the monofunctional (meth)acrylic monomer and the polyfunctional (meth)acrylic monomer provides a cured film having a high mechanical strength.

Examples of the monofunctional (meth)acrylic compounds having one acryloyl group or methacryloyl group include, but are not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenyl (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxy diethylene glycol (meth)acrylate, polyethylene glycol mono(meth)acrylate, polypropylene glycol mono(meth)acrylate, methoxy ethylene glycol (meth)acrylate, ethoxyethyl (meth)acrylate, methoxy polyethylene glycol (meth)acrylate, methoxy polypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide and N,N-dimethylaminopropyl (meth)acrylamide.

Examples of commercial products corresponding to the monofunctional (meth)acrylic compounds include, but are not limited to, Aronix (R) M101, M102, M110, M111, M113, M117, M5700, TO-1317, M120, M150 and M156 (all of which are manufactured by Toagosei Co., Ltd); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100 and #2150 (all of which are manufactured by Osaka Organic Chemical Industry Ltd.); Light Acrylate BO-A, EC-A, DMP-A, THF-A, HOP-A, HOA-MPE, HOA-MPL, PO A, P-200A, NP-4EA and NP-8EA, and Epoxy Ester M-600A (all of which are manufactured by Kyoeisha Chemical Co., Ltd.); KAYARAD (R) TC110S, R-564 and R-128H (all of which are manufactured by Nippon Kayaku Co., Ltd.); NK Ester AMP-10G and AMP-20G (both of which are manufactured by Shin-Nakamura Chemical Co., Ltd.); FA-511A, 512A and 513A (all of which are manufactured by Hitachi Chemical Co., Ltd.); PHE, CEA, PHE-2, PHE-4, BR-31, BR-31M and BR-32 (all of which are manufactured by Dai-ichi Kogyo Seiyaku Co., Ltd.); VP (manufactured by BASF SE); and ACMO, DMAA and DMAPAA (all of which are manufactured by Kohjin Co., Ltd.).

In addition, examples of the polyfunctional (meth)acrylic compounds having two or more acryloyl groups or methacryloyl groups include, but are not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantane dimethanol di(meth)acrylate, tris(2-hydroxyethyl)isocyanurate tri(meth)acrylate, tris (acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane and EO,PO-modified 2,2-bis(4-((meth)acryloxy)phenyl)propane.

Examples of commercial products corresponding to the polyfunctional (meth)acrylic compounds include, but are not limited to: Yupimer (R) UV SA1002 and SA2007 (both of which are manufactured by Mitsubishi Chemical Corporation); Viscoat #195, #230, #215, #260, #335HP, #295, #300, #360, #700, GPT and 3PA (all of which are manufactured by Osaka Organic Chemical Industry Ltd.); Light Acrylate 4EG-A, 9EG-A, NP-A, DCP-A, BP-4EA, BP-4PA, TMP-A, PE-3A, PE-4A and DPE-6A (all of which are manufactured by Kyoeisha Chemical Co., Ltd.); KAYARAD (R) PET-30, TMPTA, R-604, DPHA, DPCA-20, -30, -60 and -120, HX-620, D-310, and D-330 (all of which are manufactured by Nippon Kayaku Co., Ltd.); Aronix (R) M208, M210, M215, M220, M240, M305, M309, M310, M315, M325 and M400 (all of which are manufactured by Toagosei Co., Ltd); and Ripoxy (R) VR-77, VR-60 and VR-90 (all of which are manufactured by Showa Highpolymer Co., Ltd.).

In the above-described compound group, the term "(meth) acrylate" means an acrylate or a methacrylate having an alcohol residue equal to that of the acrylate. The term "(meth)acryloyl group" means an acryloyl group or a methacryloyl group having an alcohol residue equal to that of the acryloyl group. The abbreviation "EO" refers to ethylene oxide, and the term "EO-modified compound A" means a compound in which a (meth)acrylic acid residue and an alcohol residue of the compound A are bonded to each other through a block structure formed of an oligomer or a polymer of an ethylene oxide group. Further, the abbreviation "PO" refers to propylene oxide, and the term "PO-modified compound B" means a compound in which a (meth)acrylic acid residue and an alcohol residue of the compound B are bonded to each other through a block structure formed of an oligomer or a polymer of a propylene oxide group.

When the blending proportion of the component (a1) serving as a polymerizable compound in the curable composition (A1) is set to 50 wt % or more with respect to the total weight of the component (a1), the component (b1) and the component (c1), a cured film to be obtained can be turned into a cured film having some degree of mechanical strength.

<Component (b1): Photopolymerization Initiator>

The component (b1) serving as a photopolymerization initiator as used herein is a compound that is sensitive to light having a predetermined wavelength to generate the above-mentioned polymeric element (radical). Specifically, the photopolymerization initiator is a polymerization initiator (radical generator) that generates a radical with light (an infrared ray, a visible ray, an ultraviolet ray, a far ultraviolet ray, an X-ray, a charged particle ray, such as an electron beam or a radiant ray). The component (b1) may be formed of one photopolymerization initiator or a plurality of photopolymerization initiators.

Examples of the radical generator include, but are not limited to, 2,4,5-triarylimidazole dimers that may have a substituent, such as a 2-(o-chlorophenyl)-4,5-diphenylimidazole dimer, a 2-(o-chlorophenyl)-4,5-di(methoxyphenyl) imidazole dimer, a 2-(o-fluorophenyl)-4,5-diphenylimidazole dimer and a 2-(o- or p-methoxyphenyl)-4,5-diphenylimidazole dimer; benzophenone derivatives, such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone and 4,4'-diaminobenzophenone; α-amino aromatic ketone derivatives, such as 2-benzyl-2-dimethylamino-1-(4-morpholinophenyl)-butanone-1,2-methyl-1-[4-(methylthio)phenyl]-2-morpholino-propan-1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone and 2,3-dimethylanthraquinone; benzoin ether derivatives, such as benzoin methyl ether, benzoin ethyl ether and benzoin phenyl ether; benzoin and benzoin derivatives, such as methylbenzoin, ethylbenzoin and propylbenzoin; benzyl derivatives, such as benzyl dimethyl ketal; acridine derivatives, such as 9-phenylacridine and 1,7-bis (9,9'-acridinyl)heptane; N-phenylglycine derivatives, such as N-phenylglycine; acetophenone and acetophenone derivatives, such as 3-methylacetophenone, acetophenone benzyl ketal, 1-hydroxycyclohexyl phenyl ketone and 2,2-dimethoxy-2-phenylacetophenone; thioxanthone and thioxanthone derivatives, such as diethylthioxanthone, 2-isopropylthioxanthone and 2-chlorothioxanthone; acylphosphine oxide derivatives, such as 2,4,6-trimethylbenzoyl diphenyl phosphine oxide, bis(2,4,6-trimethylbenzoyl)phenyl phosphine oxide and bis-(2,6-dimethoxybenzoyl)-2,4,4-trimethylpentyl phosphine oxide; oxime ester derivatives, such as 1,2-octanedione, 1-[4-(phenylthio)-,2-(o-benzoyloxime)] and ethanone,1-[9-ethyl-6-(2-methylbenzoyl)-9H-carbazol-3-yl]-,1-(o-acetyloxime); xanthone; fluorenone; benzaldehyde; fluorene; anthraquinone; triphenylamine; carbazole; 1-(4-isopropylphenyl)-2-hydroxy-2-methylpropan-1-one; and 2-hydroxy-2-methyl-1-phenylpropan-1-one.

Examples of commercial products corresponding to the radical generator include, but are not limited to, Irgacure 184, 369, 651, 500, 819, 907, 784 and 2959, CGI-1700, -1750 and -1850, CG24-61, Darocur 1116 and 1173, Lucirin (R) TPO, LR8893, and LR8970 (all of which are manufactured by BASF SE), and Ubecryl P36 (manufactured by UCB).

Of those, the component (b1) is preferably an acylphosphine oxide-based polymerization initiator. The acylphosphine oxide-based polymerization initiator is, of the examples described above, an acylphosphine oxide compound, such as 2,4,6-trimethylbenzoyl diphenyl phosphine oxide, bis(2,4,6-trimethylbenzoyl)phenyl phosphine oxide or bis(2,6-dimethoxybenzoyl)-2,4,4-trimethylpentyl phosphine oxide.

The blending proportion of the component (b1) serving as a photopolymerization initiator in the curable composition (A1) is desirably 0.1 wt % or more and 50 wt % or less with respect to the total weight of the component (a1), the component (b1) and the component (c1), i.e., the total weight of all the components excluding the component (d1) serving as a solvent. In addition, the blending proportion is preferably 0.1 wt % or more and 20 wt % or less, and more preferably 10 wt % or more and 20 wt % or less.

When the blending proportion of the component (b1) in the curable composition (A1) is set to 0.1 wt % or more with respect to the total weight of the component (a1), the component (b1) and the component (c1), the curing rate of the curable composition (A1) increases and hence reaction efficiency can be improved. In addition, when the blending proportion of the component (b1) is set to 50 wt % or less with respect to the total weight of the component (a1), the component (b1) and the component (e1), a cured film to be obtained can be turned into a cured film having some degree of mechanical strength.

<Component (c1): Non-Polymerizable Compound>

The curable composition (A1) according to the present embodiment may further contain the component (c1) serving as a non-polymerizable compound in addition to the component (a1) and the component (b1) described in the foregoing in accordance with various purposes to the extent that the effects of the present embodiment are not impaired. Examples of such a component (c1) include a compound that is free of a polymerizable functional group, such as a (meth)acryloyl group, and is free of an ability to sense light having a predetermined wavelength to generate a polymeric element (radical). Examples thereof include a sensitizer, a hydrogen donor, an internal addition-type release agent, a surfactant, an antioxidant, a polymer component and other additives. A plurality of the compounds may be incorporated as the component (c1).

The sensitizer is a compound to be appropriately added for the purpose of accelerating a polymerization reaction or enhancing a reaction conversion ratio. Examples of the sensitizer include a sensitizing dye. The sensitizing dye is a compound that is excited by absorbing light having a specific wavelength to interact with the component (b1) serving as a photopolymerization initiator. The term "interaction" described herein refers to, for example, the transfer of energy or an electron from the sensitizing dye in an excited state to the component (b1) serving as a photopolymerization initiator.

Specific examples of the sensitizing dye include, but are not limited to, an anthracene derivative, an anthraquinone derivative, a pyrene derivative, a perylene derivative, a carbazole derivative, a benzophenone derivative, a thioxanthone derivative, a xanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye and a pyrylium salt-based dye.

The sensitizers may be used singly, or two or more thereof may be used as a mixture.

The hydrogen donor is a compound that reacts with an initiation radical generated from the component (b1) serving as a photopolymerization initiator or the radical of a polymerization growth terminal to generate a more reactive radical. The hydrogen donor is preferably added when the component (b1) serving as a photopolymerization initiator is a photoradical generator.

Specific examples of such a hydrogen donor include, but are not limited to, amine compounds, such as n-butylamine, di-n-butylamine, allylthiourea, triethylamine, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine and N-phenylglycine, mercapto compounds, such as 2-mercapto-N-phenylbenzimidazole and mercaptopropionic acid ester, sulfur compounds, such as s-benzylisothiuronium-p-toluenesulfinate, and phosphorous compounds, such as tri-n-butylphosphine.

The hydrogen donors may be used singly, or two or more thereof may be used as a mixture. In addition, the hydrogen donor may have a function as a sensitizer.

The internal addition-type release agent can be added to the curable composition (A1) for the purpose of reducing an interfacial bonding force between the mold and a cured product of the curable composition (A1), i.e., reducing a release force in the releasing step (4) to be described later. The term "internal addition-type" as used herein means that the release agent is added to the curable composition (A1) prior to the step of arranging the curable composition (A1).

For example, surfactants, such as a silicone-based surfactant, a fluorine-based surfactant and a hydrocarbon-based surfactant, can be used as the internal addition-type release agent. In addition, the internal addition-type release agents in the present embodiment are free of polymerizability.

Examples of the fluorine-based surfactant include a polyalkylene oxide (such as polyethylene oxide or polypropylene oxide) adduct of an alcohol having a perfluoroalkyl group, and a polyalkylene oxide (such as polyethylene oxide or polypropylene oxide) adduct of perfluoropolyether. The fluorine-based surfactant may have, for example, a hydroxyl group, an alkoxy group, an alkyl group, an amino group or a thiol group on part (for example, as a terminal group) of its molecular structure.

As the fluorine-based surfactant, a commercial product may be used. Examples of the commercial product include MEGAFACE (R) F-444, TF-2066, TF-2067 and TF-2068 (all of which are manufactured by DIC Corporation), Fluorad FC-430 and FC-431 (both of which are manufactured by Sumitomo 3M Limited), Surflon (R) S-382 (manufactured by AGC), EFTOP EF-122A, 122B and 122C, EF-121, EF-126, EF-127, and MF-100 (all of which are manufactured by Tohkem Products Corp.), PF-636, PF-6320, PF-656 and PF-6520 (all of which are manufactured by OMNOVA Solutions Inc.), UNIDYNE (R) DS-401, DS-403 and DS-451 (all of which are manufactured by Daikin Industries, Ltd.), and Ftergent (R) 250, 251, 222F and 208G (all of which are manufactured by Neos Co. Ltd.).

In addition, the internal addition-type release agent may be the hydrocarbon-based surfactant. Examples of the hydrocarbon-based surfactant include an alkyl alcohol polyalkylene oxide adduct, in which an alkylene oxide having 2 to 4 carbon atoms is added to an alkyl alcohol having 1 to 50 carbon atoms.

Examples of the alkyl alcohol polyalkylene oxide adduct include a methyl alcohol polyethylene oxide adduct, a decyl alcohol polyethylene oxide adduct, a lauryl alcohol polyethylene oxide adduct, a cetyl alcohol polyethylene oxide adduct, a stearyl alcohol polyethylene oxide adduct and a stearyl alcohol polyethylene oxide/polypropylene oxide adduct. The terminal group of the alkyl alcohol polyalkylene oxide adduct is not limited to a hydroxyl group, which is simply produced by adding a polyalkylene oxide to an alkyl alcohol. The hydroxyl group may be changed to another substituent, for example, a polar functional group, such as a carboxyl group, an amino group, a pyridyl group, a thiol group or a silanol group, or a hydrophobic functional group, such as an alkyl group or an alkoxy group.

As the alkyl alcohol polyalkylene oxide adduct, a commercial product may be used. Examples of the commercial product include polyoxyethylene methyl ether (methyl alcohol polyethylene oxide adduct) (BLAUNON MP-400, MP-550 and MP-1000) manufactured by Aoki Oil Industrial Co., Ltd., polyoxyethylene decyl ether (decyl alcohol polyethylene oxide adduct) (FINESURF D-1303, D-1305, D-1307 and D-1310) manufactured by Aoki Oil Industrial Co., Ltd., polyoxyethylene lauryl ether (lauryl alcohol polyethylene oxide adduct) (BLAUNON EL-1505) manufactured by Aoki Oil Industrial Co., Ltd., polyoxyethylene cetyl ether (cetyl alcohol polyethylene oxide adduct) (BLAUNON CH-305 and CH-310) manufactured by Aoki Oil Industrial Co., Ltd., polyoxyethylene stearyl ether (stearyl alcohol polyethylene oxide adduct) (BLAUNON SR-705, SR-707, SR-715, SR-720, SR-730 and SR-750) manufactured by Aoki Oil Industrial Co., Ltd., random polymerization-type polyoxyethylene polyoxypropylene stearyl ether (BLAUNON SA-50/50 1000R and SA-30/70 2000R) manufactured by Aoki Oil Industrial Co., Ltd., polyoxyethylene methyl ether (Pluriol (R) A760E) manufactured by BASF SE, and polyoxyethylene alkyl ethers (EMULGEN Series) manufactured by Kao Corporation.

Of those hydrocarbon-based surfactants, the alkyl alcohol polyalkylene oxide adduct is preferred as the internal addition-type release agent, and a long-chain alkyl alcohol polyalkylene oxide adduct is more preferred. The internal addition-type release agents may be used singly, or two or more thereof may be used as a mixture.

The blending proportion of the component (c1) serving as a non-polymerizable compound in the curable composition (A1) is desirably 0 wt % or more and 50 wt % or less with respect to the total weight of the component (a1), the component (b1) and the component (c1), i.e., the total weight of the components of the curable composition (A1) excluding the component (d1). In addition, the blending proportion is preferably 0.1 wt % or more and 50 wt % or less, and more preferably 0.1 wt % or more and 20 wt % or less. When the blending proportion of the component (c1) is set to 50 wt % or less with respect to the total weight of the component (a1), the component (b1) and the component (c1), a cured film to be obtained can be turned into a cured film having some degree of mechanical strength.

<Component (d1): Solvent>

The curable composition (A1) according to the present embodiment may contain the component (d1) serving as a solvent. The component (d1) is not particularly limited as long as the component is a solvent that dissolves the component (a1), the component (b1) and the component (c1). The solvent is preferably a solvent having a boiling point at normal pressure of 80° C. or more and 200° C. or less. The solvent is more preferably a solvent having at least one of an ester structure, a ketone structure, a hydroxyl group and an ether structure. The solvent is specifically, for example, a single solvent selected from the group consisting of propylene glycol monomethyl ether acetate, propylene glycol monomethyl ether, cyclohexanone, 2-heptanone, γ-butyrolactone and ethyl lactate, or a mixed solvent thereof.

<Temperature at Time of Blending of Curable Composition (A1)>

When the curable composition (A1) according the present embodiment is prepared, each component is mixed and dissolved under a predetermined temperature condition. Specifically, the preparation is performed in a range of from 0° C. or more to 100° C. or less.

<Viscosity of Curable Composition (A1)>

The curable composition (A1) according to the present embodiment is preferably liquid. This is because in the mold contacting step (2) to be described later, the spreading and filling of the curable composition (A1) are quickly completed, in other words, a filling time is short.

The viscosity at 25° C. of the composition of the components excluding the component (d1) serving as a solvent of the curable composition (A1) according to the present embodiment is preferably 1 mPa·s or more and less than 40 mPa·s. In addition, the viscosity is more preferably 1 mPa·s or more and less than 20 mPa·s. In a case where the viscosity of the curable composition (A1) is 40 mPa·s or more, the curable composition (A1) cannot be applied using an ink jet method which arranges the droplets discretely in accordance with coarseness and denseness of the desired pattern such that the residual film thickness is made uniform, thereby forming a pattern of high precision. In addition, in a case where the viscosity is lower than 1 mPa·s, when the curable composition (A1) is applied (arranged), the coating unevenness may be generated due to the flow, or the composition may flow out from the end of the mold in the contact step described later, which is not preferable.

<Surface Tension of Curable Composition (A1)>

With regard to the surface tension of the curable composition (A1) according to the present embodiment, the surface tension at 23° C. of the composition of the components thereof excluding the solvent (the component (d1)) is preferably 5 mN/m or more and 70 mN/m or less. In addition, the surface tension is more preferably 7 mN/m or more and 50 mN/m or less, and still more preferably 10 mN/m or more and 40 mN/m or less. In this case, as the surface tension becomes higher, e.g., 5 mN/m or more, a stronger capillary force acts, and hence filling (the spreading and the filling) is completed within a shorter time period at the time of the bringing of the curable composition (A1) into contact with the mold (S. Reddy, R. T. Bonnecaze/Microelectronic Engineering, 82 (2005) 60-70). In addition, when the surface tension is set to 70 mN/m or less, a cured film obtained by curing the curable compositions becomes a cured film having surface smoothness.

<Contact Angle of Curable Composition (A1)>

With regard to the contact angle of the curable composition (A1) according to the present embodiment, the contact angle of the composition of the components thereof excluding the component (d1) serving as a solvent is preferably 0° or more and 90° or less with respect to each of both the surface of the substrate and the surface of the mold. When the contact angle is more than 90°, a capillary force acts in a negative direction (direction in which a contact interface between the mold and the curable composition (A1) is shrunk) in a mold pattern or in a gap between the substrate and the mold, and hence the composition is not filled. The contact angle is particularly preferably 0° or more and 30° or less. As the contact angle becomes lower, a stronger capillary force acts, and hence the filling rate becomes faster (S. Reddy, R T Bonnecaze/Microelectronic Engineering, 82 (2005) 60-70).

<Volatility of Curable Composition (A1)>

The composition of the components excluding the component (d1) serving as a solvent of the curable composition (A1) according to the present embodiment preferably has a low volatility. In the present embodiment, a predetermined interval is provided as described later between after the curable composition (A1) is dropped on the substrate in the layering step (1) and before being brought into contact with the mold in the mold contacting step (2). During the interval, the curable composition is exposed to the atmosphere gas.

Since the composition of the components excluding the component (d1) serving as a solvent of the curable composition (A1) may be volatilized during the interval, the composition preferably has a volume reduction rate of 10% or less due to volatilization. Preferably, the weight reduction rate of the composition of the components excluding the component (d1) serving as a solvent of the curable composition (A1) 10 seconds after droplets of the curable composition (A1) are discretely dropped and layered in the layering step (1) is 10% or less. In a case where the volume reduction rate is more than 10%, a defect in pattern accuracy such as a pattern height or a residual film thickness smaller than a desired value or a defect such as failure to obtain a desired physical property value due to composition change occurs. Specifically, the vapor pressure at 20° C. of the composition of the components excluding the component (d1) serving as a solvent of the curable composition (A1) is preferably 0.5 kPa or less, more preferably 0.2 kPa or less, and particularly preferably 0.1 kPa or less.

<Impurities Mixed in Curable Composition (A1)>

It is preferred that the curable composition (A1) according to the present embodiment be free of impurities to the extent possible. The term "impurities" as used herein refers to components except the component (a1), the component (b1), the component (c1) and the component (d1) described above.

Thus, it is preferred that the curable composition (A1) according to the present embodiment be obtained through a purification step. The purification step is preferably filtration using a filter, or the like. When the filtration using a filter is performed, specifically, it is preferred that the component (a1) and the component (b1) described in the foregoing and additive components to be added as required be mixed, and then the mixture be filtered with a filter having a pore diameter of, for example, 0.001 µm or more and 5.0 µm or less. It is more preferred that the filtration using a filter be performed in a plurality of stages or be repeated a plurality of times. In addition, the filtered liquid may be filtered again. A plurality of filters having different pore diameters may be used to perform the filtration. Although a filter made of, for example, a polyethylene resin, a polypropylene resin, a fluororesin or a nylon resin can be used, the filter to be used in the filtration is not particularly limited.

Impurities, such as particles, which are mixed in the curable composition (A1), can be removed through such a purification step. Thus, the impurities, such as the particles, can be prevented from forming unexpected unevenness in the cured film to be obtained to cause a pattern defect after the curable composition (A1) is cured.

When the curable composition (A1) according to the present embodiment is used for the manufacture of a semiconductor integrated circuit, it is preferred to avoid the mixing of metal atom-containing impurities (metal impurities) in the curable composition (A1) to the extent possible in order to prevent the operation of a product from being inhibited. In this case, the concentration of the metal impurities included in the curable composition (A1) is preferably 10 ppm or less, and more preferably 100 ppb or less.

[Pattern Forming Method]

Next, steps of a pattern forming method according to the present embodiment is described with reference to the schematic cross-sectional views of FIG. 1.

A cured film obtained by the method of producing a cured film having a pattern shape according to the present embodiment is preferably a film having a pattern having a size of 1 nm or more and 10 mm or less. In addition, the cured film is more preferably a film having a pattern having a size of 10 nm or more and 100 µm or less. In general, a pattern forming technology for producing a film having a pattern (uneven structure) of a nanosize (1 nm or more and 100 nm or less) through the use of light is called a photo-nanoimprint method. The pattern forming method according to the present embodiment uses the photo-nanoimprint method. The steps are hereinafter described.

<Layering Step (1)>

In the layering step (1), as illustrated in FIG. 1(a), droplets of a curable composition (A1) 102 are discretely dropped and arranged on a substrate 101. The ink jet method is particularly preferred as a method for the arrangement. The droplets of the curable composition (A1) 102 are densely arranged on a substrate facing an area where groove portions are densely present on a mold 104 and are sparsely arranged on a substrate facing an area where groove portions are sparsely present.

Droplets of the dropped curable composition (A1) 102 spread on the substrate 101 as indicated by arrows 103 showing the direction in which droplets spread. The phenomenon is called prespread.

Thus, the thickness of a residual film 107 to be described later can be controlled to a uniform value irrespective of the density of a pattern on the mold 104.

The substrate 101 on which the curable composition (A1) 102 is to be arranged is a substrate to be processed, and a silicon wafer is typically used therefor. A layer to be processed may be formed on the substrate 101. Another layer may be further formed between the substrate 101 and the layer to be processed. In addition, when a quartz substrate is used as the substrate 101, a replica of a quartz imprint mold (quartz mold replica) can be produced.

However, the substrate 101 is not limited to the silicon wafer and the quartz substrate. The substrate 101 can be arbitrarily selected from substrates known as substrates for semiconductor devices, such as aluminum, a titanium-tungsten alloy, an aluminum-silicon alloy, an aluminum-copper-silicon alloy, silicon oxide and silicon nitride.

The adhesiveness of the surface of the substrate 101 (substrate to be processed) to be used or of the layer to be processed with the curable composition (A1) 102 may be improved by a surface treatment, such as a silane coupling treatment, a silazane treatment or the formation of an organic thin film.

<Mold Contacting Step (2)>

Figure 1B:
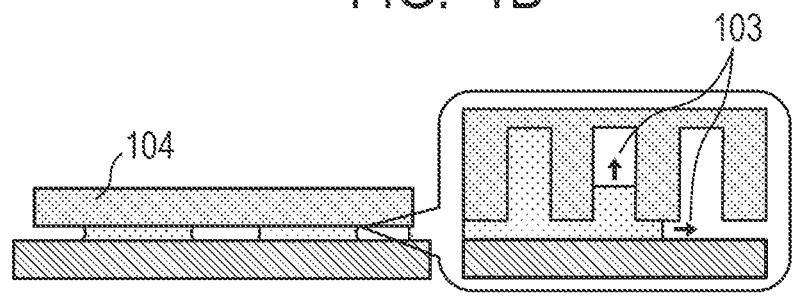

Next, as illustrated in FIG. 1(b), the mold 104 having a template pattern for transferring a pattern shape is brought into contact with the curable composition (A1) 102 arranged in the layering step (1). As a result, the droplets of the curable composition (A1) 102 spread (spreading) over the entire gap between the substrate 101 and the mold 104. Thus, as indicated by the arrows 103 indicating the spreading direction of the droplets by capillary action, a groove portion of a fine pattern on the surface of the mold 104 is filled with the curable composition (A1) 102, and hence a liquid film filled into the fine pattern of the mold 104 is obtained (enlarged portion in FIG. 1(b)).

Here, the time from the contact of the mold 104 and the curable composition (A1) 102 to the completion of the spreading and filling is referred to as the filling time.

The mold 104 that is formed of an optically transparent material is desirably used as the mold 104 considering the next light irradiation step (3). Preferred specific examples of the material for forming the mold 104 include glass, quartz, an optically transparent resin, such as PMMA or a polycarbonate resin, a transparent metal-deposited film, a flexible film made of polydimethylsiloxane or the like, a photocured film, and a metal film. In the case of using the optically transparent resin as the material for forming the mold 104, it is necessary to select a resin that does not dissolve in a component included in the curable composition (A1) 102. Quartz is particularly preferred as the material for forming the mold 104 because of its small thermal expansion coefficient and small pattern deformation.

The fine pattern on the surface of the mold 104 preferably has a pattern height of 4 nm or more and 200 nm or less. As the pattern height becomes lower, the force by which the mold 104 is released from a photocured film 106 formed of the curable composition (A1) 102 in the releasing step (4) to be described later, i.e., a release force can be reduced, and the number of release defects remaining on a mask side owing to the tearing-off of the cured film 106 having a pattern shape in association with the release reduces. A cured film 106 having a pattern shape are brought into contact with a cured films 106 having an adjacent pattern shape by the elastic deformation of the cured films 106 due to an impact at the time of the release of the mold 104, and hence the cured films 106 having a pattern shape adhere to each other or are damaged in some cases. However, when the pattern height is about twice or less as large as a pattern width (an aspect ratio is 2 or less), there is a high possibility that such inconveniences can be avoided. Meanwhile, when the pattern height is excessively low, the processing accuracy of the substrate to be processed becomes low.

The mold 104 may be subjected to a surface treatment before this step, which is a mold contacting step (2) of the curable composition (A1) 102 and the mold 104, so as to enhance the releasability between the curable composition (A1) 102 photocured in the next light irradiation step (3) and the surface of the mold 104 in the following releasing step (4). Examples of a method for the surface treatment include a method involving forming a release agent layer by applying a release agent to the surface of the mold 104. In this case, examples of the release agent to be applied to the surface of the mold 104 include a silicone-based release agent, a fluorine-based release agent, a hydrocarbon-based release agent, a polyethylene-based release agent, a polypropylene-based release agent, a paraffin-based release agent, a montan-based release agent and a carnauba-based release agent. For example, a commercially available application-type release agent such as OPTOOL (R) DSX manufactured by Daikin Industries, Ltd. can be suitably used. The release agents may be used singly, or in combinations of two or more. Of those, fluorine-based and hydrocarbon-based release agents are particularly preferred.

In the mold contacting step (2), the magnitude of the pressure to be applied to the curable composition (A1) 102 when the mold 104 and the curable composition (A1) 102 are brought into contact with each other as illustrated in FIG. 1(b) is not particularly limited. The pressure is desirably set to 0 MPa or more and 100 MPa or less. In addition, the pressure is preferably 0 MPa or more and 50 MPa or less, more preferably 0 MPa or more and 30 MPa or less, and still more preferably 0 MPa or more and 20 MPa or less.

In the mold contacting step (2), the time period for which the mold 104 and the curable composition (A1) 102 are brought into contact with each other, which is not particularly limited, is desirably set to, for example, 0.1 seconds or more and 600 seconds or less. In addition, the time period is preferably 0.1 seconds or more and 3 seconds or less, and particularly preferably 0.1 seconds or more and 1 second or less. When the time period is shorter than 0.1 seconds, the following tendency is observed: the spreading and the filling become insufficient, and hence many defects called non-filling defects occur.

Although the mold contacting step (2) can be performed under any condition of an air atmosphere, a reduced pressure atmosphere and an inert gas atmosphere, since the influence of oxygen and moisture on the curing reaction can be prevented, the reduced pressure atmosphere and the inert gas atmosphere using an inert gas for the atmosphere control gas are preferred. When this step is performed under an inert gas atmosphere, specific examples of the inert gas that can be used include nitrogen, carbon dioxide, helium, argon, various fluorocarbon gases, and a mixed gas thereof. A preferred pressure when this step is performed under a particular gas atmosphere including an air atmosphere is 0.0001 atm or more and 10 atm or less.

The mold contacting step (2) may be performed under an atmosphere containing a condensable gas (hereinafter referred to as "condensable gas atmosphere") using the condensable gas as an atmosphere control gas. The term "condensable gas" as used herein refers to the following gas: when the gas in the atmosphere is filled into a groove portion of the fine pattern formed on the mold 104, and the gap between the mold 104 and the substrate 101 together with the curable composition (A1) 102, the gas is condensed by a capillary pressure generated at the time of the filling to liquefy. The condensable gas is present as a gas in the atmosphere before the curable composition (A1) 102 and the mold 104 are brought into contact with each other (FIG. 1(a)) in the mold contacting step (2).

When the mold contacting step (2) is performed under the condensable gas atmosphere, the gas filled into a groove portion of the fine pattern is liquefied by a capillary pressure generated by the curable composition (A1) 102, and hence air bubbles disappear. Accordingly, a filling property becomes excellent. The condensable gas may dissolve in the curable composition (A1) 102.

The boiling point of the condensable gas, which is not limited as long as the boiling point is equal to or less than the ambient temperature of the mold contacting step (2), is preferably from −10° C. to 23° C., and more preferably from 10° C. to 23° C. When the boiling point falls within the range, the filling property is more excellent.

The vapor pressure of the condensable gas at the ambient temperature in the mold contacting step (2), which is not limited as long as the vapor pressure is equal to or less than the mold pressure at the time of imprinting in the mold contacting step (2), is preferably from 0.1 MPa to 0.4 MPa. When the boiling point falls within the range, the filling property is more excellent. When the vapor pressure at the ambient temperature is more than 0.4 MPa, the following tendency is observed: an air bubble disappearing effect cannot be sufficiently obtained. On the other hand, when the vapor pressure at the ambient temperature is less than 0.1 MPa, the following tendency is observed: pressure reduction is needed and hence an apparatus becomes complicated. The ambient temperature in the mold contacting step (2), which is not particularly limited, is preferably from 20° C. to 25° C.

Specific examples of the condensable gas include fluorocarbons, such as: a chlorofluorocarbon (CFC), such as trichlorofluoromethane; a fluorocarbon (FC); a hydrochlorofluorocarbon (HCFC); a hydrofluorocarbon (HFC), such as 1,1,1,3,3-pentafluoropropane ($CHF_2CH_2CF_3$, HFC-245fa, PFP); and a hydrofluoroether (HFE), such as pentafluoroethyl methyl ether ($CF_3CF_2OCH_3$, HFE-245mc).

Of those, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether are preferred from a viewpoint that when the ambient temperature in the mold contacting step (2) is from 20° C. to 25° C., the filling property is excellent. Further, 1,1,1,3,3-pentafluoropropane is particularly preferred from the viewpoint of being excellent in safety.

The condensable gases may be used singly, or two or more thereof may be used as a mixture. In addition, any such condensable gas may be mixed with a non-condensable gas, such as air, nitrogen, carbon dioxide, helium or argon, before use. The non-condensable gas with which the condensable gas is mixed is preferably helium from the viewpoint of the filling property. Helium can permeate the mold 104. Accordingly, when the gases (the condensable gas and helium) in the atmosphere are filled into a groove portion of the fine pattern formed on the mold 104 in the mold contacting step (2) together with the curable composition (A1), the condensable gas liquefies, and helium permeates the mold 104.

<Light Irradiation Step (3)>

Figure 1C:
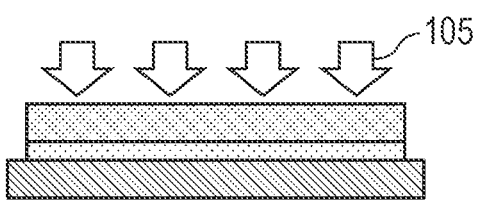

Next, as illustrated in FIG. 1(c), the curable composition (A1) 102 is irradiated with irradiation light 105 through the mold 104. In more detail, the curable composition (A1) 102 filled into the fine pattern of the mold 104 is irradiated with the irradiation light 105 through the mold 104. Thus, the curable composition (A1) 102 filled into the fine pattern of the mold 104 is cured by the irradiation light 105 to become the cured film 106 having a pattern shape.

In this case, the irradiation light 105 with which the curable composition (A1) 102 filled into the fine pattern of the mold 104 is irradiated is selected depending on the sensitive wavelengths of the curable composition (A1) 102. Specifically, it is preferred that UV light having a wavelength of 150 nm or more and 400 nm or less, an X-ray, an electron beam, or the like be appropriately selected and used.

Of those, the irradiation light 105 is particularly preferably UV light. This is because many of the compounds commercially available as curing aids (photopolymerization initiators) have sensitivity to UV light. In this case, examples of the light source of UV light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser and a F2 excimer laser, and an ultra-high pressure mercury lamp is particularly preferred. In addition, the number of the light sources to be used may be one or two or more. Further, the entire surface of the curable composition (A1) 102 filled into the fine pattern of the mold 104 may be irradiated with light, or only part of area thereof may be irradiated with light.

In addition, the light irradiation step (3) may be performed on an entire area on the substrate 101 intermittently a plurality of times or may be continuously performed on the entire area. Further, the following may be performed: part of an area A is irradiated with the light in a first irradiating process, and an area B different from the area A is irradiated with the light in a second irradiating process.

<Releasing Step (4)>

Figure 1D:
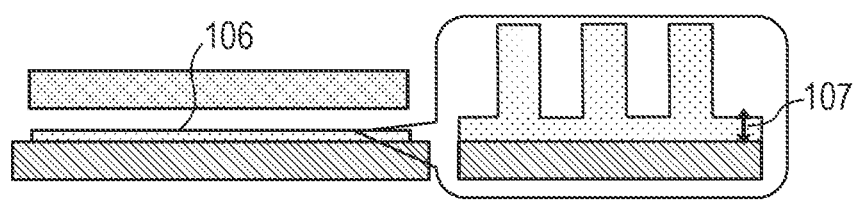

Next, in the releasing step (4), the cured film 106 having a pattern shape and the mold 104 are separated from each other. In this step, as illustrated in FIG. 1(d), the cured film 106 having a pattern shape and the mold 104 are separated from each other, and hence the cured film 106 having a pattern shape serving as the reverse pattern of the fine pattern formed on the mold 104, the film being formed in the light irradiation step (3), is obtained in a free-standing state. A cured film remains in a groove portion of uneven pattern of the cured film 106 having a pattern shape, and the film is called the residual film 107 (see enlarged portion in FIG. 1(d)).

When the mold contacting step (2) is performed under the condensable gas atmosphere, the condensable gas vaporizes in association with a reduction in pressure of the interface at which the cured film 106 and the mold 104 are in contact with each other at the time of the separation of the cured film 106 and the mold 104 in the releasing step (4). Thus, a reducing effect on the release force serving as a force needed for separating the cured film 106 and the mold 104 from each other tends to be exhibited.

A method of separating the cured film 106 having a pattern shape and the mold 104 from each other is not particularly limited as long as part of the cured film 106 having a pattern shape is not physically damaged at the time of the separation, and various conditions and the like are not particularly limited, either. For example, the following may be performed: the substrate 101 (substrate to be processed) is fixed and the mold 104 is released by being moved in a direction receding from the substrate 101. Alternatively, the following may be performed: the mold 104 is fixed and the substrate 101 is released by being moved in a direction receding from the mold 104. Alternatively, the substrate 101 and the mold 104 may be pulled in directions diametrically opposite to each other in order to achieve the release.

The above layering step (1) to releasing step (4) are referred to as "shot," and by performing steps (manufacturing process) including performing shots continuously on a plurality of areas where the mold is brought into contact with the resist (that is, areas where a pattern is formed on the substrate 101) (hereinafter, referred to as "shot area"), a cured film having a desired uneven pattern shape (pattern shape attributed to the uneven shape of the mold 104) in the plurality of shot areas on the substrate 101 can be obtained.

Further, a series of step units from the mold contacting step (2) to the releasing step (4) will be referred to as an imprinting step (Im).

First Embodiment

Next, a pattern forming method according to a first embodiment will be described.

The pattern forming method according to the first embodiment is one mode of the photo-nanoimprint method.

Specifically, the method includes performing a layering step (1) of discretely dropping droplets of the curable composition (A1) containing at least the component (a1) serving as a polymerizable compound to layer the droplets on each of a plurality of shot areas on the surface of a substrate; a mold contacting step (2) of bringing the curable composition (A1) into contact with a mold; a light irradiation step (3) of irradiating the curable composition (A1) with light from a side of the mold to cure the composition; and a releasing step (4) of separating the mold from the cured product of the curable composition (A1) in this order.

The steps from the mold contacting step (2) to the releasing step (4) are collectively referred to as an imprinting step (Im), and after performing the layering step (1), a waiting step (M) is performed in which neither the layering step (1) nor the imprinting step (Im) is performed.

Further, a required time Td for the layering step (1) in one shot area and a required time Ti for the imprinting step (Im) in one shot area are adjusted to be equal to each other.

Then, when r shot area groups (r is 2 or more) are present on one substrate, the number of shot areas included in a certain shot area group n (n=1, 2, . . . , r) is $m_n$ ($m_n$ is 2 or more), the maximum value of the number of shot areas $m_n$ is $m_{max}$, and the No. of each shot area is set to S(v) (v is an integer of 1 or more and ($m_1+m_2+ \ldots +m_r$) or less, the layering step (1) is sequentially performed on each of the shot areas S(1), S(2), . . . , S($m_1$) included in the shot area group 1, and after performing the waiting step (M) for the required time (Td×($m_{max}-m_1$)), the imprinting step (Im) is performed on each of the shot areas S(1), S(2), . . . , S($m_1$) included in the shot area group 1 in the order in which the layering step (1) is performed.

Next, the layering step (1) is sequentially performed on each of the shot areas S($m_1$+1), S($m_1$+2), . . . , S($m_1+m_2$) included in another shot area group 2, and after performing the waiting step (M) for the required time (Td×($m_{max}-m_2$)), the imprinting step (Im) is performed on each of the shot areas S($m_1$+1), S($m_1$+2), S($m_1+m_2$) included in the shot area group 2 in the order in which the layering step (1) is performed.

Then, each of the steps is performed in the above manner on each of the shot areas included in the remaining shot area groups 3 to r.

Figure 2:
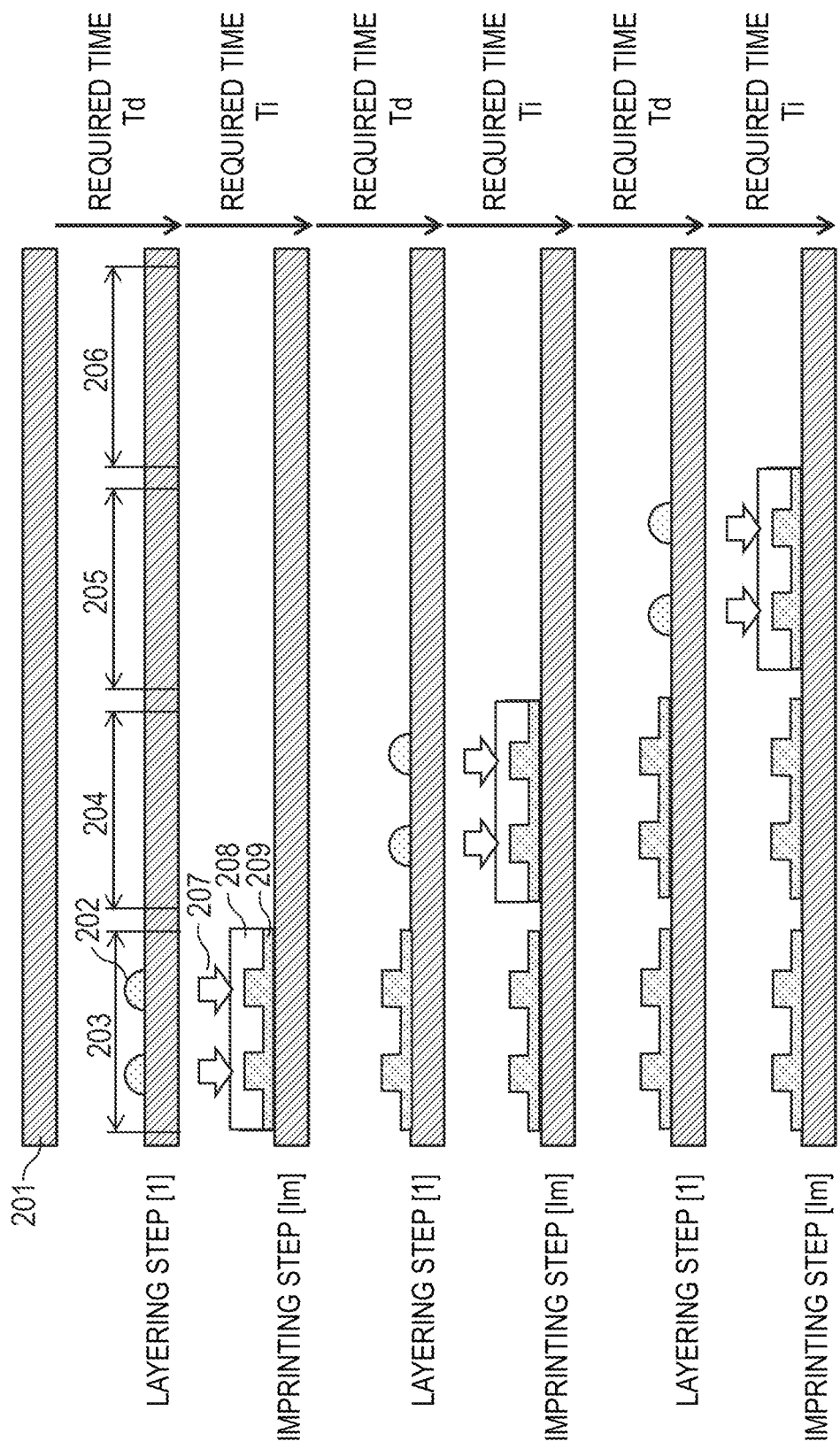
FIG. 2 is a schematic cross-sectional view illustrating steps of a conventional pattern forming method.

FIG. 2 is a schematic cross-sectional view illustrating steps of a conventional pattern forming method.

In the conventional pattern forming method, as illustrated in FIG. 2, a layering step (1) is first performed on a shot area S(1) 203 on a substrate 201 to discretely drop and arrange the droplets of a curable composition (A1) 202.

Thereafter, the imprinting step (Im) including the steps from the mold contacting step (2) to the releasing step (4) is performed, and through the contact between the curable composition (A1) 202 and a mold 208 and the curing of the curable composition (A1) 202 by irradiation with an irradiation light 207, a cured film 209 having a free-standing pattern shape on the substrate 201 can be obtained.

Next, the layering step (1) and the imprinting step (Im) are sequentially performed on a shot area S(2) 204 on the substrate 201, and subsequently, the layering step (1) and the imprinting step (Im) is also performed on each of shot areas 205 and 206.

Here, in the mold contacting step (2), spreading of droplets of the curable composition (A1) 202 proceeds over the entire gap between the substrate 201 and the mold 208 by capillary action. Since the time required for the spreading is long, the filling time is prolonged, and the throughput becomes low in the conventional pattern forming method.

Therefore, the waiting step (M) (not illustrated) can be performed in order to make the prespread of the droplets of the curable composition (A1) 202 proceed from the completion of the layering step (1) to the start of the mold contacting step (2). By performing the waiting step (M), the time required for the spreading of the curable composition (A1) 202 after contacting with the mold 208 in the mold contacting step (2) becomes shorter than that in the case without the waiting step (M). That is, the required time for the mold contacting step (2) is shortened.

However, since the total required time per shot is increased by the required time for the waiting step (M), the throughput is reduced.

Figure 3:
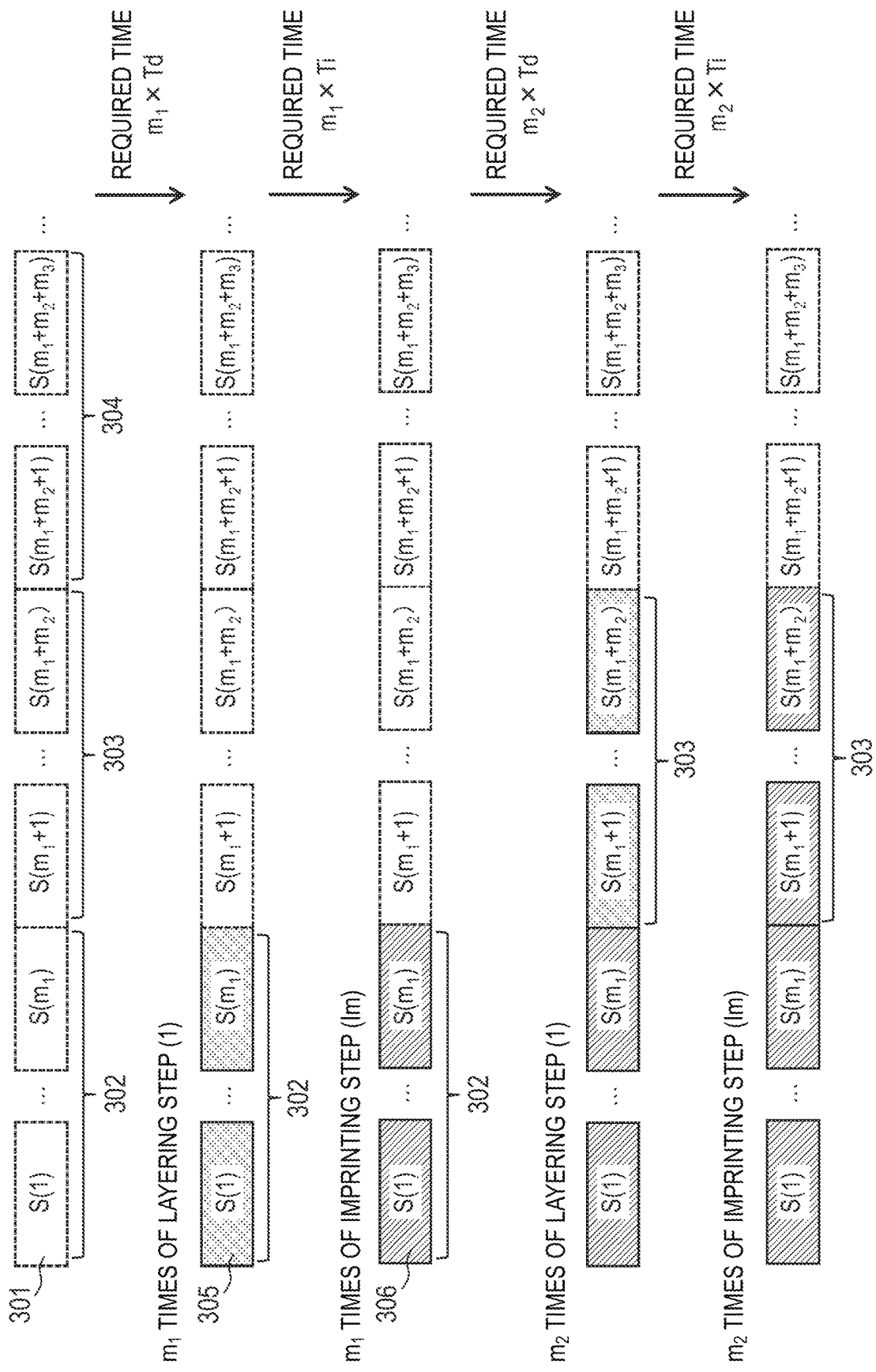
FIG. 3 is a schematic view illustrating steps of a conventional pattern forming method.

FIG. 3 is a schematic view illustrating steps of another conventional pattern forming method.

In the pattern forming method, first, the layering step (1) is sequentially performed on each of the shot areas S(1), S(2), S($m_1$) included in a shot area group (1) 302 on the substrate, and droplets of a curable composition (A1) 305 are discretely dropped and sequentially arranged on each of the shot areas S(1), S(2), S($m_1$) included in the shot area group (1) 302 on the substrate.

Thereafter, the imprinting step (Im) including the steps from the mold contacting step (2) to the releasing step (4) is performed in the order in which the layering step (1) is performed, and through the contact between the curable composition (A1) 305 and the mold and the curing of the curable composition (A1) 305 by irradiation with the irradiation light on each of the shot areas S(1), S(2), . . . , S($m_1$) included in the shot area group (1) 302, a cured film 306 having a free-standing pattern shape on the substrate can be obtained.

Next, the layering step (1) is sequentially performed on each of the shot areas S($m_1$+1), S($m_1$+2), . . . , S($m_1+m_2$) included in a shot area group (2) 303 on the substrate, and droplets of the curable composition (A1) 305 are discretely dropped and sequentially arranged on each of the shot areas S($m_1$+1), S($m_1$+2), . . . , S($m_1+m_2$) included in the shot area group (2) 303 on the substrate.

Thereafter, the imprinting step (Im) including the steps from the mold contacting step (2) to the releasing step (4) is performed in the order in which the layering step (1) is performed, and through the contact between the curable composition (A1) 305 and the mold and the curing of the curable composition (A1) 305 by irradiation with the irradiation light on each of the shot areas S($m_1$+1), S($m_1$+2), . . . , S($m_1+m_2$) included in the shot area group (2) 303, a cured film 306 having a free-standing pattern shape on the substrate can be obtained.

Then, the steps are performed on each of the shot areas included in the remaining shot area groups as described above.

Here, assuming that the required time for the layering step (1) for one shot area is Td, and the required time for the imprinting step (Im) for one shot area is Ti, the interval time from the completion of the layering step (1) to the start of the imprinting step (Im) in each of the shot areas S(u) (u=1, 2, . . . , $m_1$) of the shot area group (1) 302 is represented by ($m_1-u$)×Td+(u−1)×Ti.

If the required times Td and Ti are different from each other, in a predetermined shot area group, the interval time from the completion of the layering step (1) to the start of the imprinting step (Im) in each of the shot areas will be different from each other.

Further, even if the required times Td and Ti are the same as each other, if the number m (=$m_1, m_2, m_3, \ldots, m_r$) (each m is 2 or more) of shot areas included in each of the shot area groups is not equal to each other, the interval time from the completion of the layering step (1) to the start of the imprinting step (Im) is different between shot area groups having different numbers m of shot areas.

In addition, assuming that Td>Ti, there is a tendency that the later the shot area in the predetermined shot area group is processed, the shorter the interval time from the completion of the layering step (1) to the start of the imprinting step (Im).

On the other hand, in the case of Td<Ti, the later the shot area is processed, the longer the interval time.

In a shot area group having a large number m of shot areas, the interval time tends to be long, while in a shot area group having a small number m of shot areas, the interval time becomes short.

Therefore, in the shot area where the interval time is short, the prespread does not proceed sufficiently. In a case where the prespread does not proceed sufficiently, the time (filling time) from the start of the mold contact to the completion of the spreading and filling becomes long, which causes a problem of a decrease in throughput.

Here, in a case where the waiting step is provided between the completion of the layering step (1) and the start of the mold contacting step (2) where the mold comes into contact with the composition, proceeding of the prespread is facilitated such that the time required for the spreading after the mold contact becomes shorter than that in the case without the waiting step.

However, in a case where the waiting step is simply provided, the required time per shot increases accordingly and thus the throughput decreases.

In view of the above, in the present embodiment, the high throughput is achieved by using a pattern forming method as described below.

Figure 4:
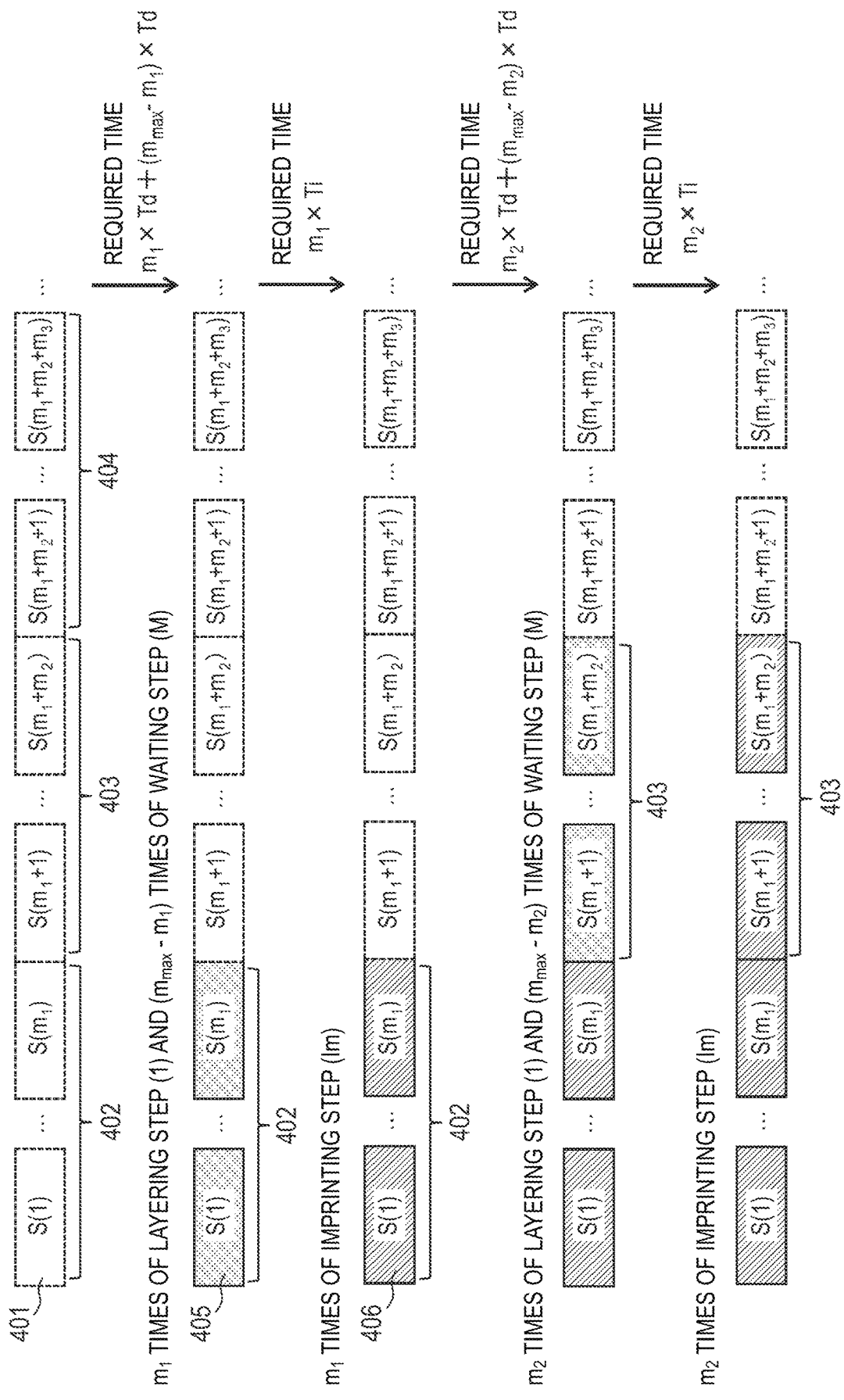
FIG. 4 is a schematic view illustrating steps of the pattern forming method according to a first embodiment.

FIG. 4 is a schematic view illustrating steps of the pattern forming method according to the first embodiment.

In the pattern forming method according to the first embodiment, the required time Td for the layering step (1) for one shot area and the required time Ti for the imprinting step (Im) for one shot area are adjusted to be times T equal to each other.

Then, when the maximum value of the number m ($m_1$, $m_2$, $m_3$, ..., $m_r$) (m is 2 or more) of shot areas is $m_{max}$, the waiting step (M) for the required time ($Td \times (m_{max}-m_n)$) is performed after the layering step (1) of each shot area group (n) is completed.

First, as illustrated in FIG. 4, the layering step (1) is sequentially performed on each of the shot areas S(1), S(2), ..., S($m_1$) included in a shot area group (1) 402 on a substrate 401, and droplets of a curable composition (A1) 405 are discretely dropped and arranged on each of the shot areas S(1), S(2), ..., S($m_1$) included in the shot area group (1) 402 on the substrate 401.

Thereafter, the waiting step (M) is performed ($m_{max}-m_1$) times (that is, for the required time ($Td \times (m_{max}-m_1)$)).

Then, the imprinting step (Im) including the steps from the mold contacting step (2) to the releasing step (4) is performed in the order in which the layering step (1) is performed, and through the contact between the curable composition (A1) 405 and the mold and the curing of the curable composition (A1) 405 by irradiation with the irradiation light on each of the shot areas S(1), S(2), ..., S($m_1$) included in the shot area group (1) 402, a cured film 406 having a free-standing pattern shape on the substrate 401 can be obtained.

Next, the layering step (1) is sequentially performed on each of the shot areas S($m_1$+1), S($m_1$+2), ..., S($m_1$+$m_2$) included in a shot area group (2) 403 on the substrate, and droplets of the curable composition (A1) 405 are discretely dropped and sequentially arranged on each of the shot areas S($m_1$+1), S($m_1$+2), ..., S($m_1$+$m_2$) included in the shot area group (2) 403 on the substrate.

Thereafter, the waiting step (M) is performed for the required time ($Td \times (m_{max}-m_2)$).

Then, the imprinting step (Im) including the steps from the mold contacting step (2) to the releasing step (4) is performed in the order in which the layering step (1) is performed, and through the contact between the curable composition (A1) 405 and the mold and the curing of the curable composition (A1) 405 by irradiation with the irradiation light on each of the shot areas S($m_1$+1), S($m_1$+2), ..., S($m_1$+$m_2$) included in the shot area group (2) 403, a cured film 406 having a free-standing pattern shape on the substrate can be obtained.

Then, the steps are performed on each of the shot areas included in the remaining shot area groups as described above.

As described above, in the pattern forming method according to the first embodiment, the interval time from the completion of the layering step (1) to the start of the imprinting step (Im) in each shot area S(k) of the shot area group having the number m of shot areas becomes (m−k)×Td+($m_{max}$−m)×Td+(k−1)×Ti=($m_{max}$−1)×T, which does not depend on the number m of shot areas.

Accordingly, in the pattern forming method according to the first embodiment, in predetermined shot area groups, the interval times from the completion of the layering step (1) to the start of the imprinting step (Im) in each shot area become equal to each other, and even if the number m of shot areas is different among the shot area groups, the interval times from the completion of the layering step (1) to the start of the imprinting step (Im) become equal to each other.

Thus, since the prespread can be made uniform in all of the shot areas, by quickly completing the spreading in the mold contacting step (2) in all of the shot areas, the required time for the mold contacting step (2) can be shortened and a uniform imprinting result can be obtained.

Next, a pattern forming method according to the first embodiment is described in a further specified manner.

Figure 6:
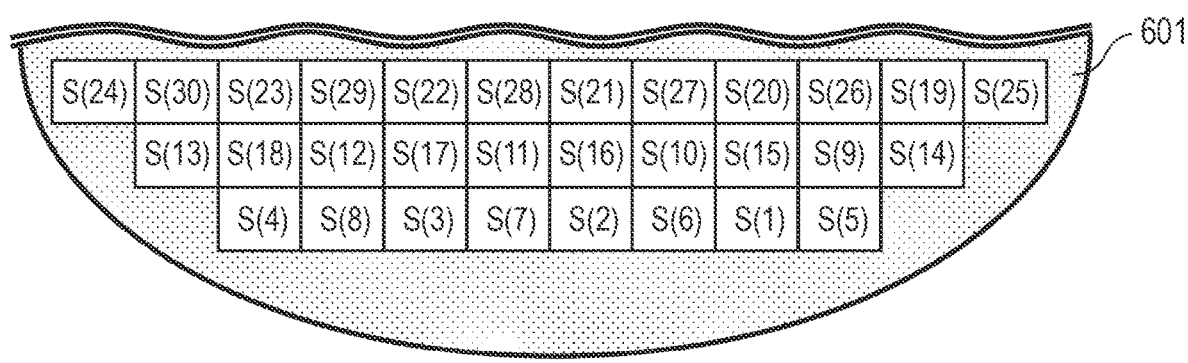
FIG. 6 is a layout view of shot areas on a substrate used in the pattern forming method according to the present embodiment.

For example, there are 30 shot areas S(1), S(2), ..., S(30) on a substrate 601 as illustrated in FIG. 6, and the shot areas are allocated to six shot area groups r (r=1, 2, ..., 6) as shown in Table 1 below.

TABLE 1

| Shot area group r | Shot area S(v) | Number $m_n$ of shot areas |
|---|---|---|
| Shot area group 1 | S(1), S(2), S(3), S(4) | $m_1 = 4$ |
| Shot area group 2 | S(5), S(6), S(7), S(8) | $m_2 = 4$ |
| Shot area group 3 | S(9), S(10), S(11), S(12), S(13) | $m_3 = 5$ |
| Shot area group 4 | S(14), S(15), S(16), S(17), S(18) | $m_4 = 5$ |
| Shot area group 5 | S(19), S(20), S(21), S(22), S(23), S(24) | $m_5 = 6(=m_{max})$ |
| Shot area group 6 | S(25), S(26), S(27), S(28), S(29), S(30) | $m_6 = 6(=m_{max})$ |

At this time, according to the pattern forming method of the first embodiment, each shot area on the substrate 601 is processed as follows.

Figure 7A:
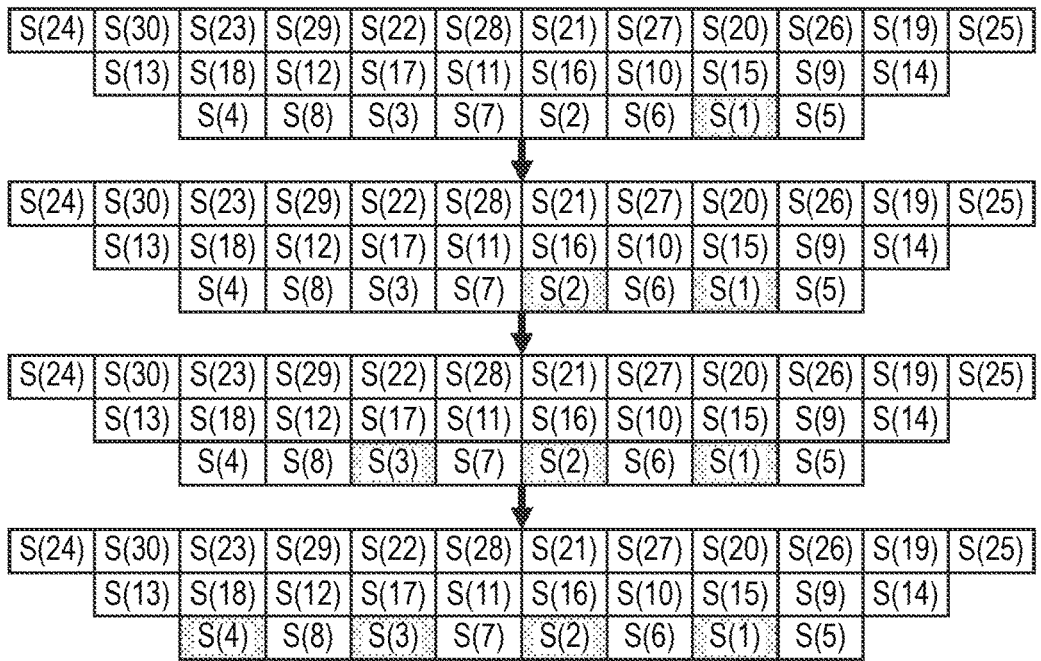
FIGS. 7A, 7B, and 7C are schematic views illustrating steps of the pattern forming method according to the first embodiment.

First, as illustrated in FIG. 7(a), the layering step (1) is sequentially performed on each of shot areas S(1), S(2), S(3) and S(4) included in a shot area group 1 on the substrate 601.

Figure 7B:
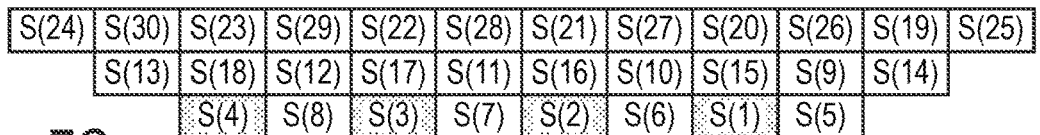

Then, as illustrated in FIG. 7(b), the waiting step (M) is performed for ($Td \times (m_{max}-m_1)$)=($Td \times (6-4)$)=2Td.

Figure 7C:
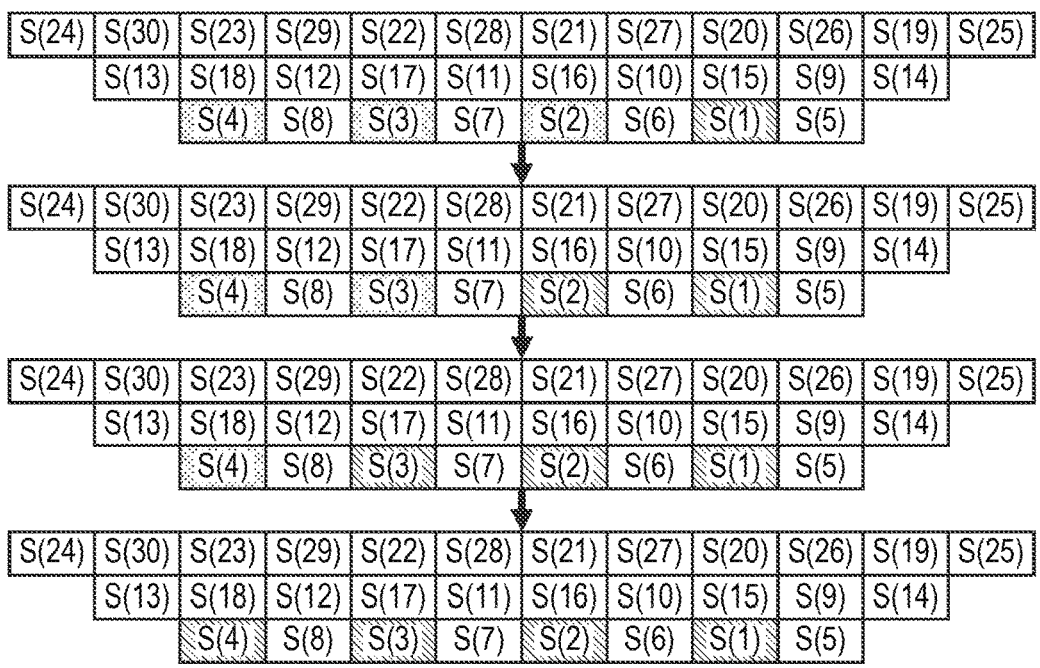

Thereafter, as illustrated in FIG. 7(c), the imprinting step (Im) is performed on each of the shot areas S(1), S(2), S(3) and S(4) included in the shot area group 1 on the substrate 601 in the order in which the layering step (1) is performed.

Then, the same process is performed on each of shot areas S(5), S(6), S(7) and S(8) included in a shot area group 2 on the substrate 601 (not illustrated).

Figure 8A:
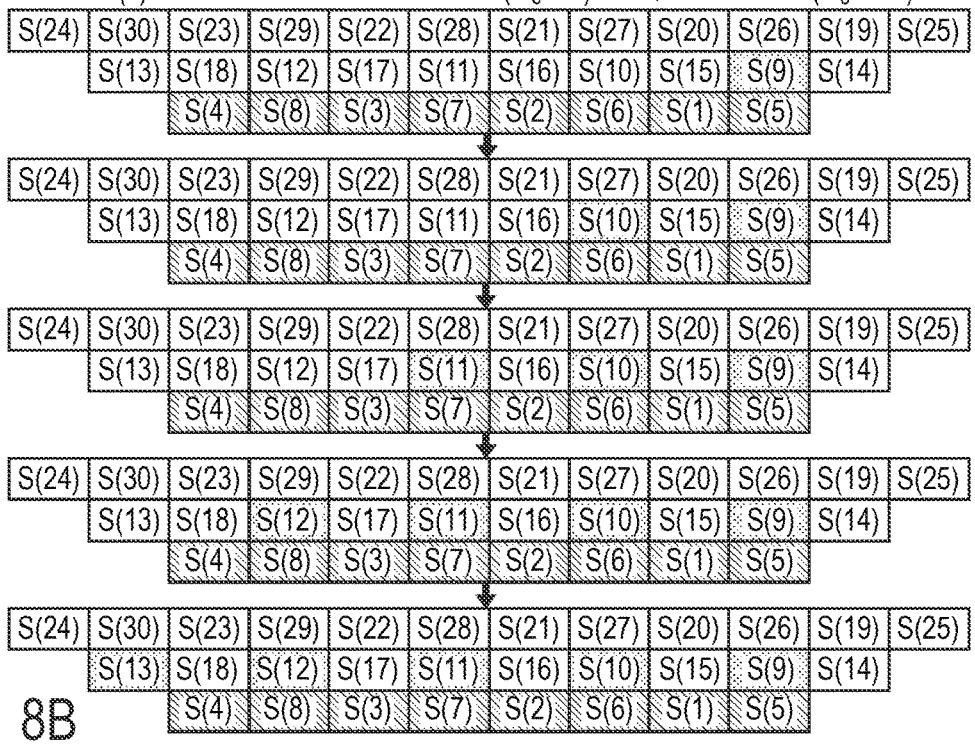
FIGS. 8A, 8B, and 8C are schematic views illustrating steps of the pattern forming method according to the first embodiment.

Next, as illustrated in FIG. 8(a), the layering step (1) is sequentially performed on each of shot areas S(9), S(10), S(11), S(12) and S(13) included in a shot area group 3 on the substrate 601.

Figure 8B:
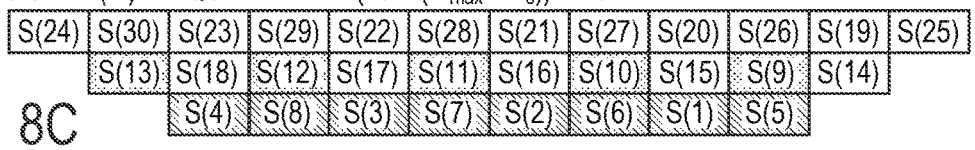

Then, as illustrated in FIG. 8(b), the waiting step (M) is performed for ($Td \times (m_{max}-m_3)$)=($Td \times (6-5)$)=Td.

Figure 8C:
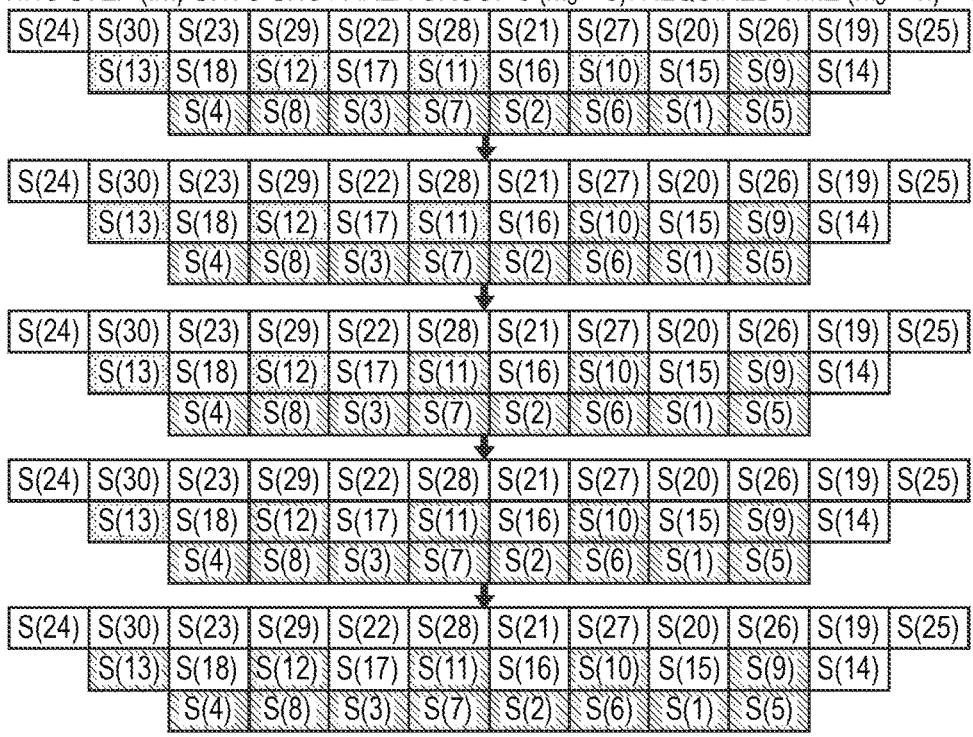

Thereafter, as illustrated in FIG. 8(c), the imprinting step (Im) is performed on each of the shot areas S(9), S(10), S(11), S(12) and S(13) included in the shot area group 3 on the substrate 601 in the order in which the layering step (1) is performed.

Then, the same process is performed on each of shot areas S(14), S(15), S(16), S(17) and S(18) included in a shot area group 4 on the substrate 601 (not illustrated).

Further, as illustrated in FIG. 9(a), the layering step (1) is sequentially performed on each of shot areas S(19), S(20), S(21), S(22), S(23) and S(24) included in a shot area group 5 on the substrate 601.

Then, as illustrated in FIG. 9(b), the imprinting step (Im) is performed on each of the shot areas S(19), S(20), S(21), S(22), S(23) and S(24) included in the shot area group 5 on the substrate 601 in the order in which the layering step (1) is performed.

In the shot area group 5, $(Td \times (m_{max} - m_5)) = (Td \times (6-6)) = 0$ is satisfied, and thus the waiting step (M) is not performed.

Then, the same process is performed on each of shot areas S(25), S(26), S(27), S(28), S(29) and S(30) included in a shot area group 6 on the substrate 601 (not illustrated).

The flow of the above processing steps for the substrate 601 is shown in Table 2 below. The symbol o in Table 2 represents the waiting step (M) of the required time Td.

TABLE 2

| | Step order | | | | | | | | | |
|---|---|---|---|---|---|---|---|---|---|---|
| | 1 | 2 | 3 | 4 | 5 | 6 | 7 | 8 | 9 | 10 |
| | | | | | Shot area group 1 | | | | | |
| Layering step (1) | S(1) | S(2) | S(3) | S(4) | | | | | | |
| Imprinting step (Im) | | | | | | | S(1) | S(2) | S(3) | S(4) |
| Waiting step (M) | | | | | o | o | | | | |
| | Step order | | | | | | | | | |
| | 11 | 12 | 13 | 14 | 15 | 16 | 17 | 18 | 19 | 20 |
| | | | | | Shot area group 2 | | | | | |
| Layering step (1) | S(5) | S(6) | S(7) | S(8) | | | | | | |
| Imprinting step (Im) | | | | | | | S(5) | S(6) | S(7) | S(8) |
| Waiting step (M) | | | | | o | o | | | | |
| | 21 | 22 | 23 | 24 | 25 | 26 | 27 | 28 | 29 | 30 | 31 |
| | | | | | | Shot area group 3 | | | | | |
| Layering step (1) | S(9) | S(10) | S(11) | S(12) | S(13) | | | | | | |
| Imprinting step (Im) | | | | | | | S(9) | S(10) | S(11) | S(12) | S(13) |
| Waiting step (M) | | | | | | o | | | | | |
| | Step order | | | | | | | | | | |
| | 32 | 33 | 34 | 35 | 36 | 37 | 38 | 39 | 40 | 41 | 42 |
| | | | | | | Shot area group 4 | | | | | |
| Layering step (1) | S(14) | S(15) | S(16) | S(17) | S(18) | | | | | | |
| Imprinting step (Im) | | | | | | | S(14) | S(15) | S(16) | S(17) | S(18) |
| Waiting step (M) | | | | | | o | | | | | |
| | Step order | | | | | | | | | | |
| | 43 | 44 | 45 | 46 | 47 | 48 | 49 | 50 | 51 | 52 | 53 | 54 |
| | | | | | | Shot area group 5 | | | | | | |
| Layering step (1) | S(19) | S(20) | S(21) | S(22) | S(23) | S(24) | | | | | | |
| Imprinting step (Im) | | | | | | | | S(19) | S(20) | S(21) | S(22) | S(23) | S(24) |
| Waiting step (M) | | | | | | | | | | | | |
| | Step order | | | | | | | | | | |
| | 55 | 56 | 57 | 58 | 59 | 60 | 61 | 62 | 63 | 64 | 65 | 66 |
| | | | | | | Shot area group 6 | | | | | | |
| Layering step (1) | S(25) | S(26) | S(27) | S(28) | S(29) | S(30) | | | | | | |
| Imprinting step (Im) | | | | | | | | S(25) | S(26) | S(27) | S(28) | S(29) | S(30) |
| Waiting step (M) | | | | | | | | | | | | |

Second Embodiment

Next, a pattern forming method according to a second embodiment will be described.

The pattern forming method according to the second embodiment is one mode of the photo-nanoimprint method.

Specifically, the method includes performing a layering step (1) of discretely dropping droplets of the curable composition (A1) containing at least the component (a1) serving as a polymerizable compound to layer the droplets on each of a plurality of shot areas on the surface of a substrate; a mold contacting step (2) of bringing the curable composition (A1) into contact with a mold; a light irradiation step (3) of irradiating the curable composition (A1) with light from a side of the mold to cure the composition; and a releasing step (4) of separating the mold from the cured product of the curable composition (A1) in this order.

Then, the steps from the mold contacting step (2) to the releasing step (4) is collectively referred to as an imprinting step (Im), and after performing the layering step (1) or the imprinting step (Im), a waiting step (M) is performed in which neither the layering step (1) nor the imprinting step (Im) is performed.

Further, a required time Td for the layering step (1) in one shot area and a required time Ti for the imprinting step (Im) in one shot area are adjusted to be equal to each other.

Then, when r shot area groups (r is 2 or more) are present on one substrate, and the number of shot areas included in a certain shot area group n (n=1, 2, . . . , r) is $m_n$ ($m_n$ is 2 or more), the maximum value of the number $m_n$ of shot areas is $m_{max}$, and the No. of each shot area is set to S(v) (v is an integer of 1 or more and $(m_1+m_2+ \ldots +m_r)$ or less), the layering step (1) is sequentially performed on each of shot areas $S(1)$, $S(2)$, . . . , $S(m_1)$ (first plurality of shot areas) included in a shot area group 1 (first shot area group), and after performing the waiting step (M) for the required time $(Td \times (m_{max}-m_1))$ thereafter, the waiting step (M) is performed for the required time $(Ti \times m_{max})$.

Next, the layering step (1) is sequentially performed on each of shot areas $S(m_1+1)$, $S(m_1+2)$, . . . , $S(m_1+m_2)$ included in a shot area group 2, and after performing the waiting step (M) for the required time $(Td \times (m_{max}-m_2))$ thereafter, the imprinting step (Im) is performed on each of the shot areas $S(1), S(2), \ldots, S(m_1)$ included in the shot area group 1 in the order in which the layering step (1) is performed, and the waiting step (M) is performed for the required time $(Ti \times (m_{max}-m_1))$ thereafter.

Next, the layering step (1) is sequentially performed on each of shot areas $S(m_1+m_2+ \ldots +m_{k-1}+1)$, $S(m_1+m_2+ \ldots +m_{k-1}+2)$, . . . , $S(m_1+m_2+ \ldots +m_{k-1}+m_k)$ (k-th plurality of shot areas) included in a shot area group k (k-th shot area group), and after performing the waiting step (M) for the required time $(Td \times (m_{max}-m_k))$ thereafter, the imprinting step (Im) is performed on each of shot areas $S(m_1+m_2+ \ldots +m_{k-2}+1)$, $S(m_1+m_2+ \ldots +m_{k-2}+2)$, . . . , $S(m_1+m_2+ \ldots +m_{k-2}+m_{k-1})$ included in a shot area group k-1 in the order in which the layering step (1) is performed, and the waiting step (M) is performed for the required time $(Ti \times (m_{max}-m_{k-1}))$ thereafter. This is repeated from k=3 to r when r is 3 or more.

Finally, the waiting step (M) is performed for the required time $(Td \times m_{max})$, and the imprinting step (Im) is performed on each of shot areas $S(m_1+m_2+ \ldots +m_{r-1}+1)$, $S(m_1+m_2+ \ldots +m_{r-1}+2)$, . . . , $S(m_1+m_2+ \ldots +m_{r-1}+m_r)$ (r-th plurality of shot areas) included in a shot area group r (r-th shot area group) in the order in which the layering step (1) is performed.

Figure 5:
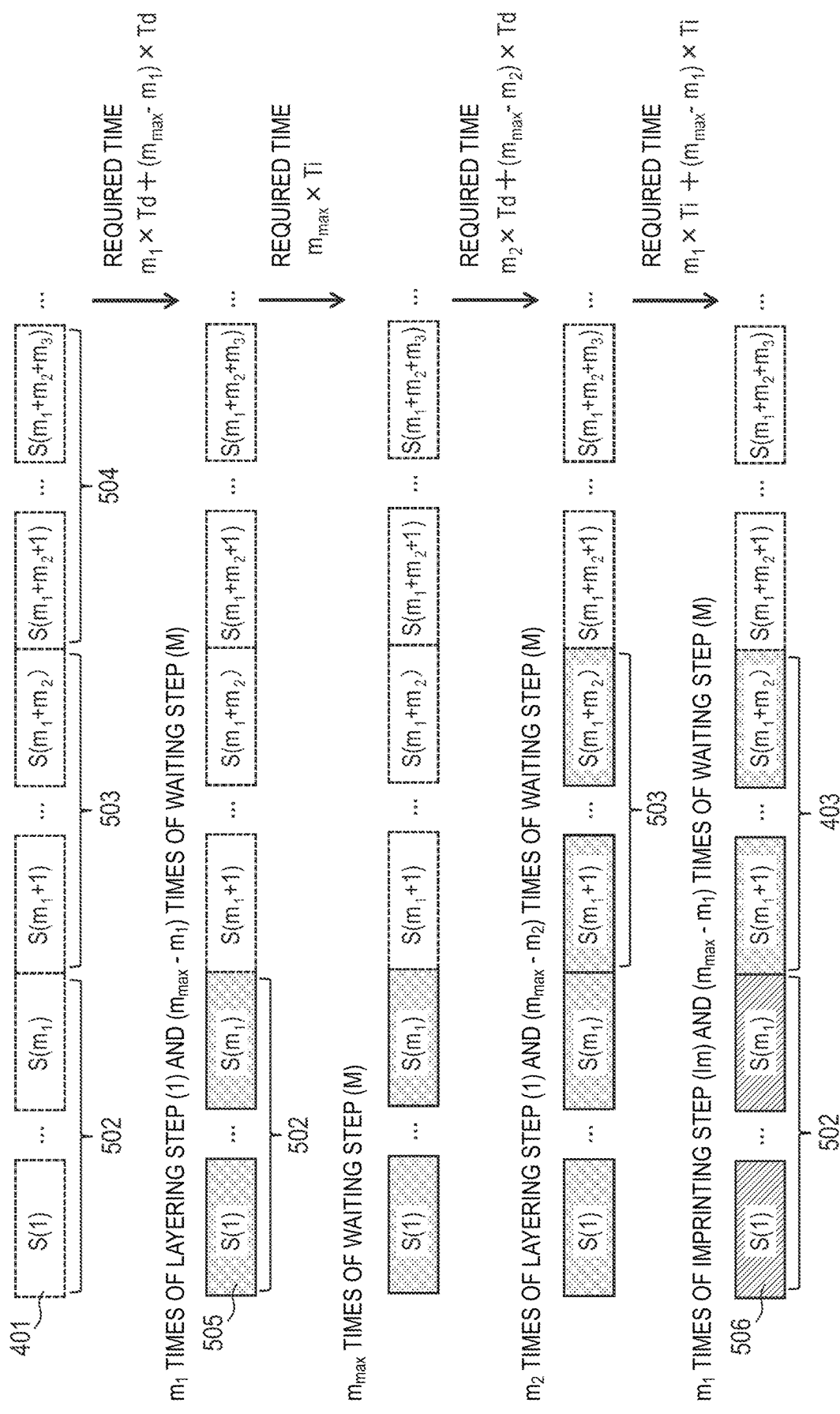
FIG. 5 is a schematic view illustrating steps of the pattern forming method according to a second embodiment.

FIG. 5 is a schematic view illustrating steps of the pattern forming method according to the second embodiment.

In the pattern forming method according to the second embodiment, the required time Td for the layering step (1) for one shot area and the required time Ti for the imprinting step (Im) for one shot area are adjusted to be times T equal to each other.

First, as illustrated in FIG. 5, the layering step (1) is sequentially performed on each of the shot areas $S(1)$, $S(2)$, . . . , $S(m_1)$ included in a shot area group (1) 502 among the r shot area groups (r is 2 or more) on a substrate 501, and droplets of a curable composition (A1) 505 are discretely dropped and arranged on each of the shot areas $S(1)$, $S(2)$, . . . , $S(m_1)$ included in the shot area group (1) 502 on the substrate 501.

Thereafter, the waiting step (M) is performed $(m_{max}-m_1)$ times (that is, for the required time $(Td \times (m_{max}-m_1))$).

Then, the waiting step (M) is performed $m_{max}$ times (that is, for the required time $(Ti \times m_{max})$).

Next, the layering step (1) is sequentially performed on each of shot areas $S(m_1+1)$, $S(m_1+2)$, . . . , $S(m_1+m_2)$ included in a shot area group (2) 503 on the substrate 501, and droplets of the curable composition (A1) 505 are discretely dropped and arranged on each of the shot areas $S(m_1+1), S(m_1+2), \ldots, S(m_1+m_2)$ included in the shot area group (2) 503 on the substrate 501.

Thereafter, the waiting step (M) is performed $(m_{max}-m_2)$ times (that is, for the required time $(Td \times (m_{max}-m_2))$).

Next, on each of the shot areas $S(1), S(2), \ldots, S(m_1)$ included in the shot area group (1) 502, the imprinting step (Im) including the steps from the mold contacting step (2) to the releasing step (4) is performed in the order in which the layering step (1) is performed, and through the contact between the curable composition (A1) 505 and the mold and the curing of the curable composition (A1) 505 by irradiation with the irradiation light, a cured film 506 having a free-standing pattern shape on the substrate 501 can be obtained.

Thereafter, the waiting step (M) is performed $(m_{max}-m_1)$ times (that is, for the required time $(Ti \times (m_{max}-m_1))$).

Next, the layering step (1) is sequentially performed on each of the shot areas $S(m_1+m_2+ \ldots +m_{k-1}+1)$, $S(m_1+m_2+ \ldots +m_{k-1}+2)$, . . . , $S(m_1+m_2+ \ldots +m_{k-1}+m_k)$ included in the shot area group k on the substrate 501, and after performing the waiting step (M) $(m_{max}-m_k)$ times (that is, for the required time $(Td \times (m_{max}-m_k))$) thereafter, the imprinting step (Im) is performed on each of the shot areas $S(m_1+m_2+ \ldots +m_{k-2}+1)$, $S(m_1+m_2+ \ldots +m_{k-2}+2)$, . . . , $S(m_1+m_2+ \ldots +m_{k-2}+m_{k-1})$ included in the shot area group k-1 in the order in which the layering step (1) is performed, and the waiting step (M) is performed $(m_{max}-m_{k-1})$ times (that is, for the required time $(Ti \times (m_{max}-m_{k-1}))$) thereafter. This is repeated from k=3 to r when r is 3 or more (not illustrated).

Finally, after performing the waiting step (M) $m_{max}$ times (that is, for the required time $(Td \times m_{max})$), the imprinting step (Im) is performed on each of the shot areas $S(m_1+m_2+ \ldots +m_{r-1}+1)$, $S(m_1+m_2+ \ldots +m_{r-1}+2)$, . . . , $S(m_1+m_2+ \ldots +m_{r-1}+m_r)$ included in the shot area group r in the order in which the layering step (1) is performed (not illustrated). The pattern forming is performed in this manner.

In the pattern forming method according to the second embodiment, in a certain shot area S(v) included in the shot area group n among the r shot area groups (r is 2 or more), the interval time from the completion of the layering step (1)

to the start of the imprinting step (Im) is determined as $(3m_{max}-1) \times T$ from the sum of the following required times (1) to (5) (where Td=Ti=T).

(1) Total required time for the layering step in each of $(m_n-v)$ shot areas after the shot area S(v) of the shot area group n: $(m_n-v) \times Td$ (2) Required time for the waiting step (M): $(m_{max}-m_n) \times Td$ (3) Required time for the waiting step (M) (when n=1) or total required time for the imprinting step (Im) and the waiting step (M) in each shot area included in the shot area group (n−1): $m_{max} \times Ti$ (4) Required time for the waiting step (M) (when n=r) or total required time for the layering step (1) and the waiting step (M) in each shot area included in the shot area group (n+1): $m_{max} \times Td$ (5) Total required time for the imprinting step (Im) in each of (v−1) shot areas up to shot area S(v) of the shot area group (n): $(v-1) \times Ti$ As described above, in the pattern forming method according to the second embodiment, a longer interval time than that in the pattern forming method according to the first embodiment is set equally for all the shot areas.

Therefore, proceeding of the prespread of the droplets of a curable composition (A) is facilitated in the interval time, and the spreading in the mold contacting step (2) is completed more quickly, and the required time for the mold contacting step (2) can be further shortened.

Next, a pattern forming method according to the second embodiment is described in a further specified manner.

For example, there are 30 shot areas S(1), S(2), . . . , S(30) on a substrate 601 as illustrated in FIG. 6, and the shot areas are allocated to six shot area groups r (r=1, 2, . . . , 6) as shown in Table 1.

At this time, according to the pattern forming method according to the second embodiment, each shot area on the substrate 601 is processed as follows.

First, as illustrated in FIG. 10(a), the layering step (1) is sequentially performed on each of shot areas S(1), S(2), S(3) and S(4) included in a shot area group 1 on the substrate 601.

Then, as illustrated in FIG. 10(b), the waiting step (M) is performed for $(Td \times (m_{max}-m_1))=(Td \times (6-4))=2Td$.

Thereafter, as illustrated in FIG. 10(c), the waiting step (M) is performed for $(Ti \times m_{max})=6Ti$.

Figure 11A:
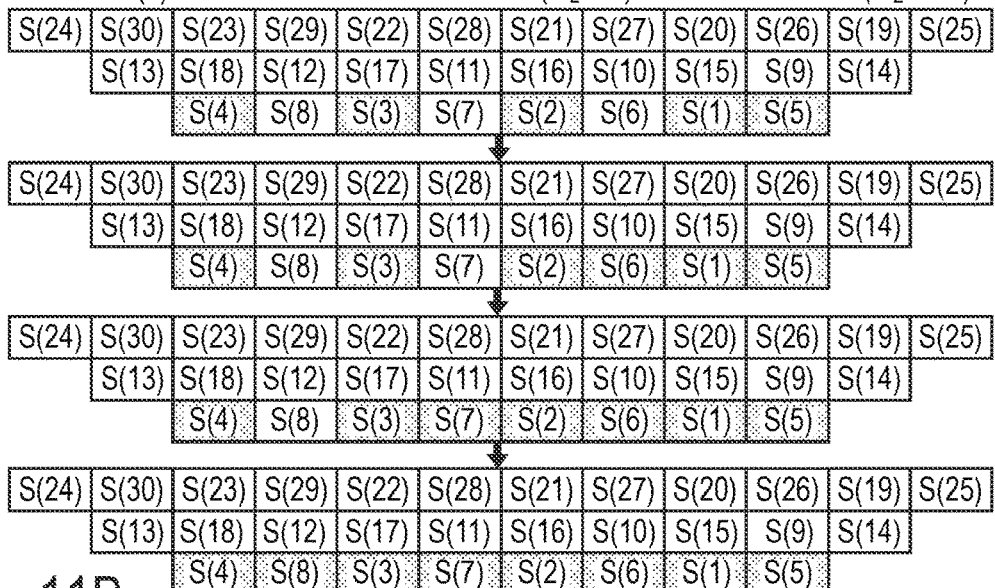
FIGS. 11A, 11B, 11C, and 11D are schematic views illustrating steps of the pattern forming method according to the second embodiment.

Next, as illustrated in FIG. 11(a), the layering step (1) is sequentially performed on each of shot areas S(5), S(6), S(7) and S(8) included in a shot area group 2 on the substrate 601.

Figure 11B:
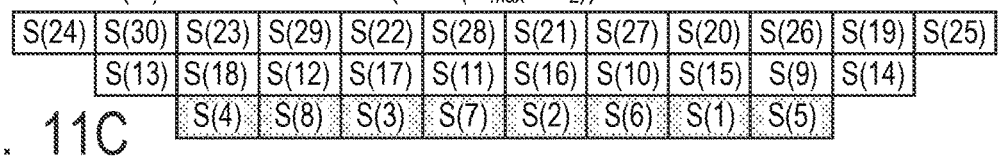

Then, as illustrated in FIG. 11(b), the waiting step (M) is performed for $(Td \times (m_{max}-m_2))=(Td \times (6-4))=2Td$.

Figure 11C:
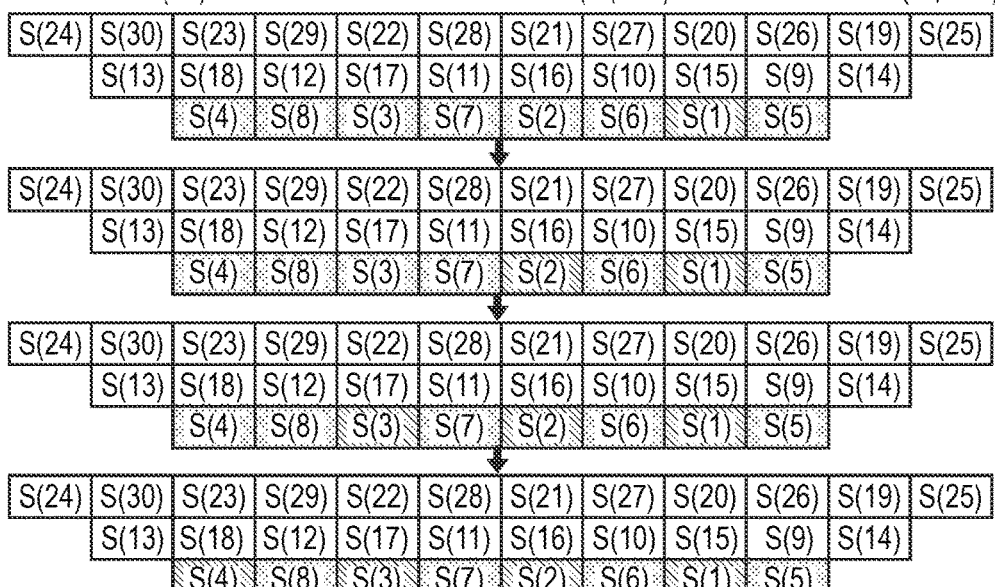

Thereafter, as illustrated in FIG. 11(c), the imprinting step is performed on each of the shot areas S(1), S(2), S(3) and S(4) included in the shot area group 1 on the substrate 601 in the order in which the layering step (1) is performed.

Figure 11D:
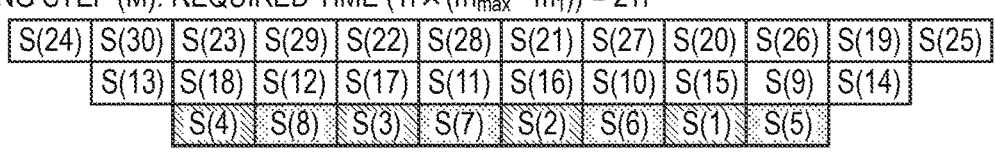

Then, as illustrated in FIG. 11(d), the waiting step (M) is performed for $(Ti \times (m_{max}-m_1))=(Ti \times (6-4))=2Ti$.

Figure 12A:
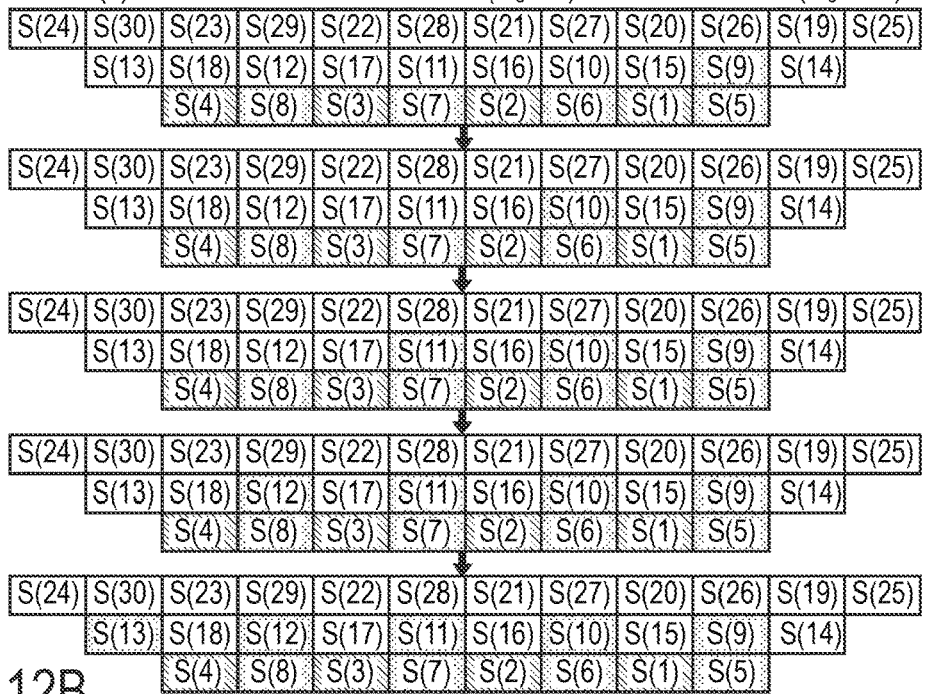
FIGS. 12A, 12B, 12C, and 12D are schematic views illustrating steps of the pattern forming method according to the second embodiment.

Next, as illustrated in FIG. 12(a), the layering step (1) is sequentially performed on each of shot areas S(9), S(10), S(11), S(12) and S(13) included in a shot area group 3 on the substrate 601.

Figure 12B:
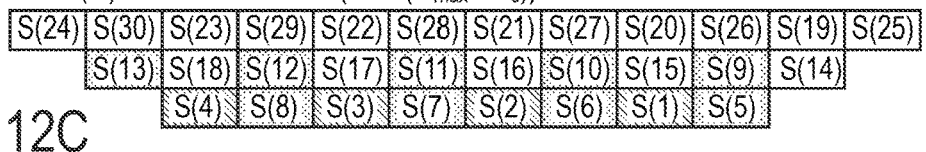

Then, as illustrated in FIG. 12(b), the waiting step (M) is performed for $(Td \times (m_{max}-m_3))=(Td \times (6-5))=Td$.

Figure 12C:
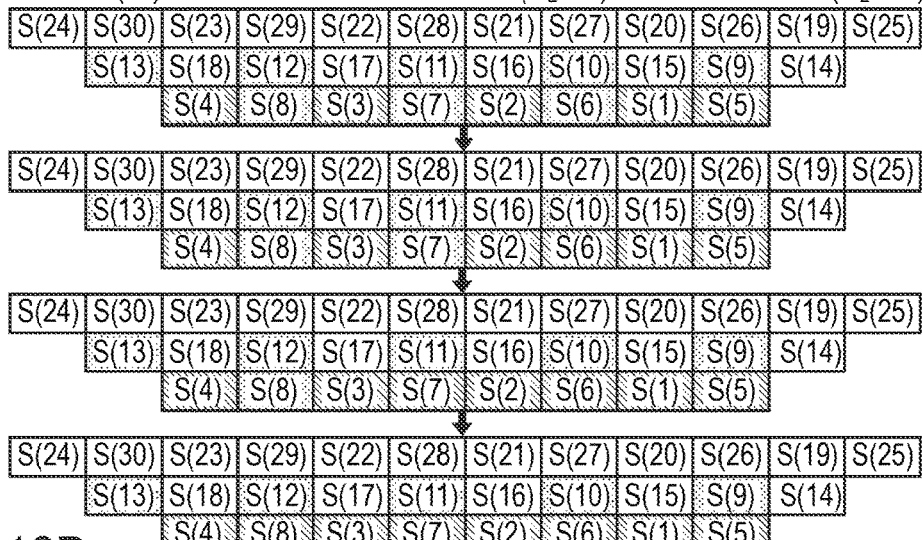

Thereafter, as illustrated in FIG. 12(c), the imprinting step is performed on each of the shot areas S(5), S(6), S(7) and S(8) included in the shot area group 2 on the substrate 601 in the order in which the layering step (1) is performed.

Figure 12D:
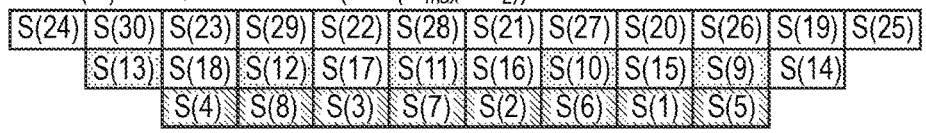

Then, as illustrated in FIG. 12(d), the waiting step (M) is performed for $(Ti \times (m_{max}-m_2))=(Ti \times (6-4))=2Ti$.

Next, as illustrated in FIG. 13(a), the layering step (1) is sequentially performed on each of shot areas S(14), S(15), S(16), S(17) and S(18) included in a shot area group 4 on the substrate 601.

Then, as illustrated in FIG. 13(b), the waiting step (M) is performed for $(Td \times (m_{max}-m_4))=(Td \times (6-5))=Td$.

Thereafter, as illustrated in FIG. 13(c), the imprinting step is performed on each of the shot areas S(9), S(10), S(11), S(12) and S(13) included in the shot area group 3 on the substrate 601 in the order in which the layering step (1) is performed.

Then, as illustrated in FIG. 13(d), the waiting step (M) is performed for $(Ti \times (m_{max}-m_3))=(Ti \times (6-5))=Ti$.

Figure 14A:
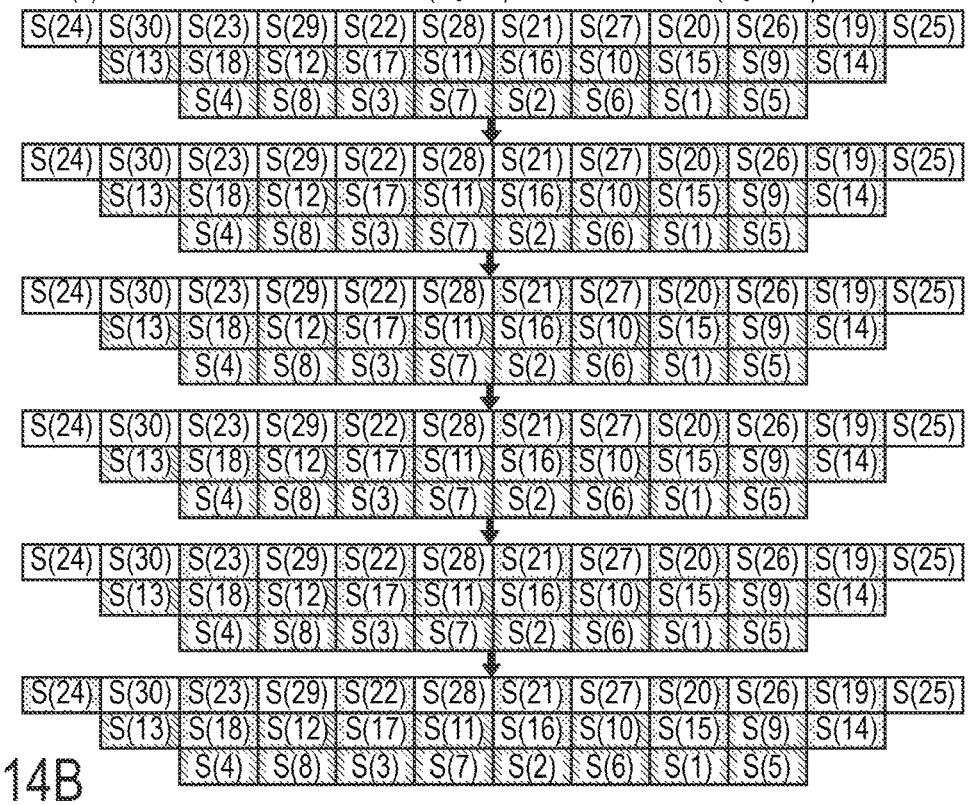
FIGS. 14A, 14B, and 14C are schematic views illustrating steps of the pattern forming method according to the second embodiment.

Next, as illustrated in FIG. 14(a), the layering step (1) is sequentially performed on each of shot areas S(19), S(20), S(21), S(22), S(23) and S(24) included in a shot area group 5 on the substrate 601.

In the shot area group 5, $(Td \times (m_{max}-m_5))=(Td \times (6-6))=0$ is satisfied, and thus the waiting step (M) is not performed.

Figure 14B:
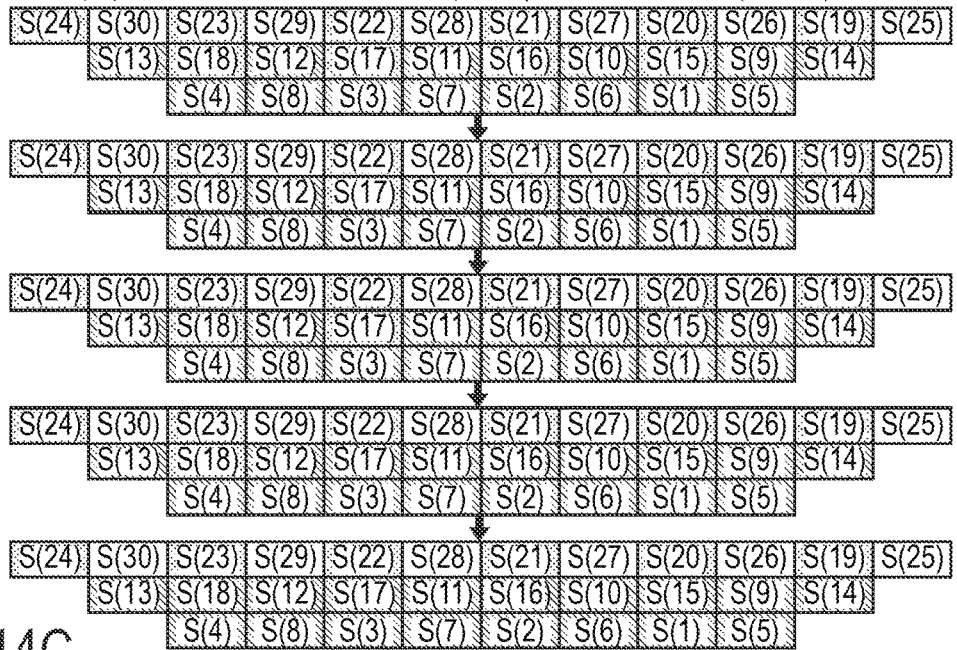

Thereafter, as illustrated in FIG. 14(b), the imprinting step is performed on each of the shot areas S(14), S(15), S(16), S(17) and S(18) included in the shot area group 4 on the substrate 601 in the order in which the layering step (1) is performed.

Figure 14C:
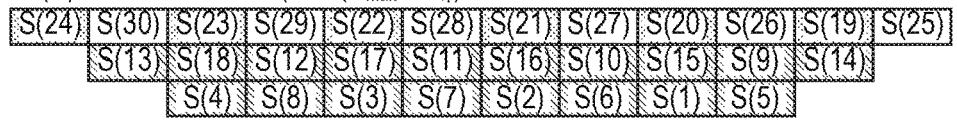

Then, as illustrated in FIG. 14(c), the waiting step (M) is performed for $(Ti \times (m_{max}-m_4))=(Ti \times (6-5))=Ti$.

Figure 15A:
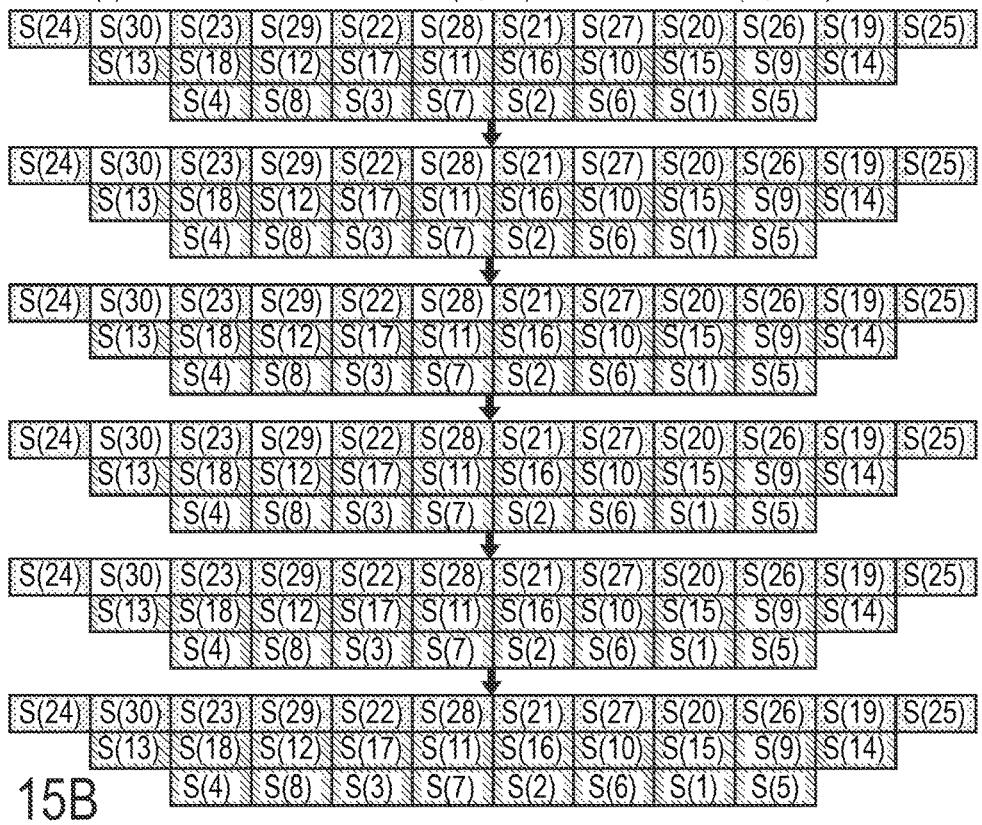
FIGS. 15A and 15B are schematic views illustrating steps of the pattern forming method according to the second embodiment.

Next, as illustrated in FIG. 15(a), the layering step (1) is sequentially performed on each of shot areas S(25), S(26), S(27), S(28), S(29) and S(30) included in a shot area group 6 on the substrate 601.

In the shot area group 6, $(Td \times (m_{max}-m_6))=(Td \times (6-6))=0$ is satisfied, and thus the waiting step (M) is not performed.

Figure 15B:
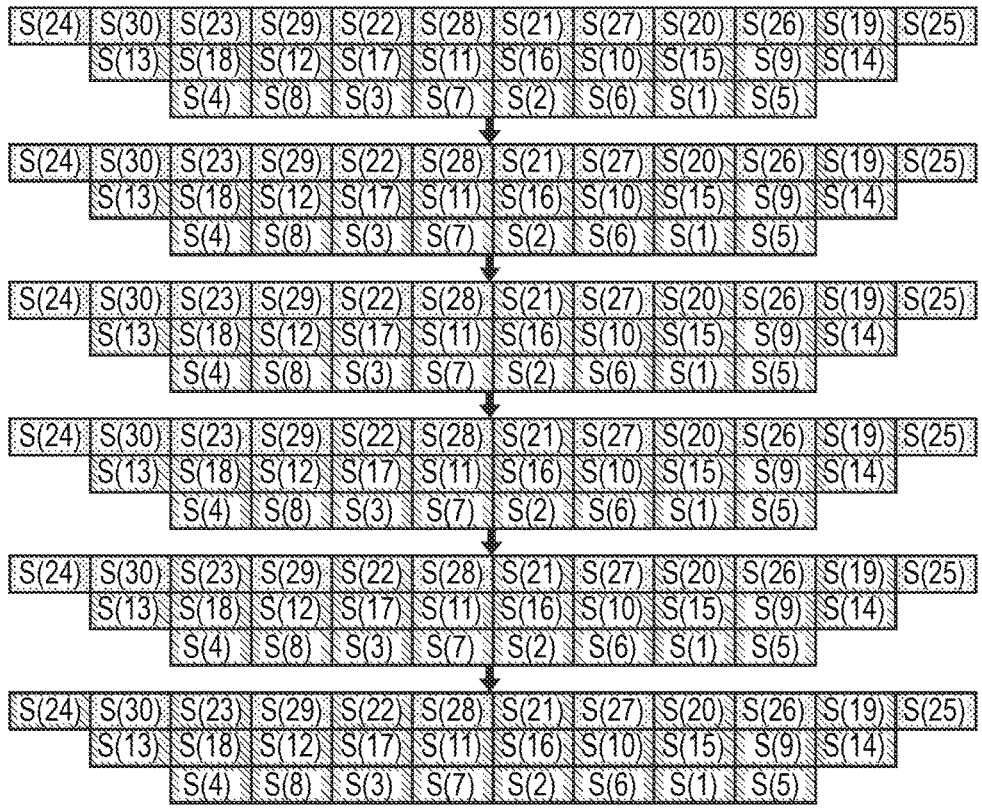

Thereafter, as illustrated in FIG. 15(b), the imprinting step is performed on each of the shot areas S(19), S(20), S(21), S(22), S(23) and S(24) included in the shot area group 5 on the substrate 601 in the order in which the layering step (1) is performed.

In the shot area group 5, $(Ti \times (m_{max}-m_5))=(Ti \times (6-6))=0$ is satisfied, and thus the waiting step (M) is not performed.

Figures 16A, 16B:
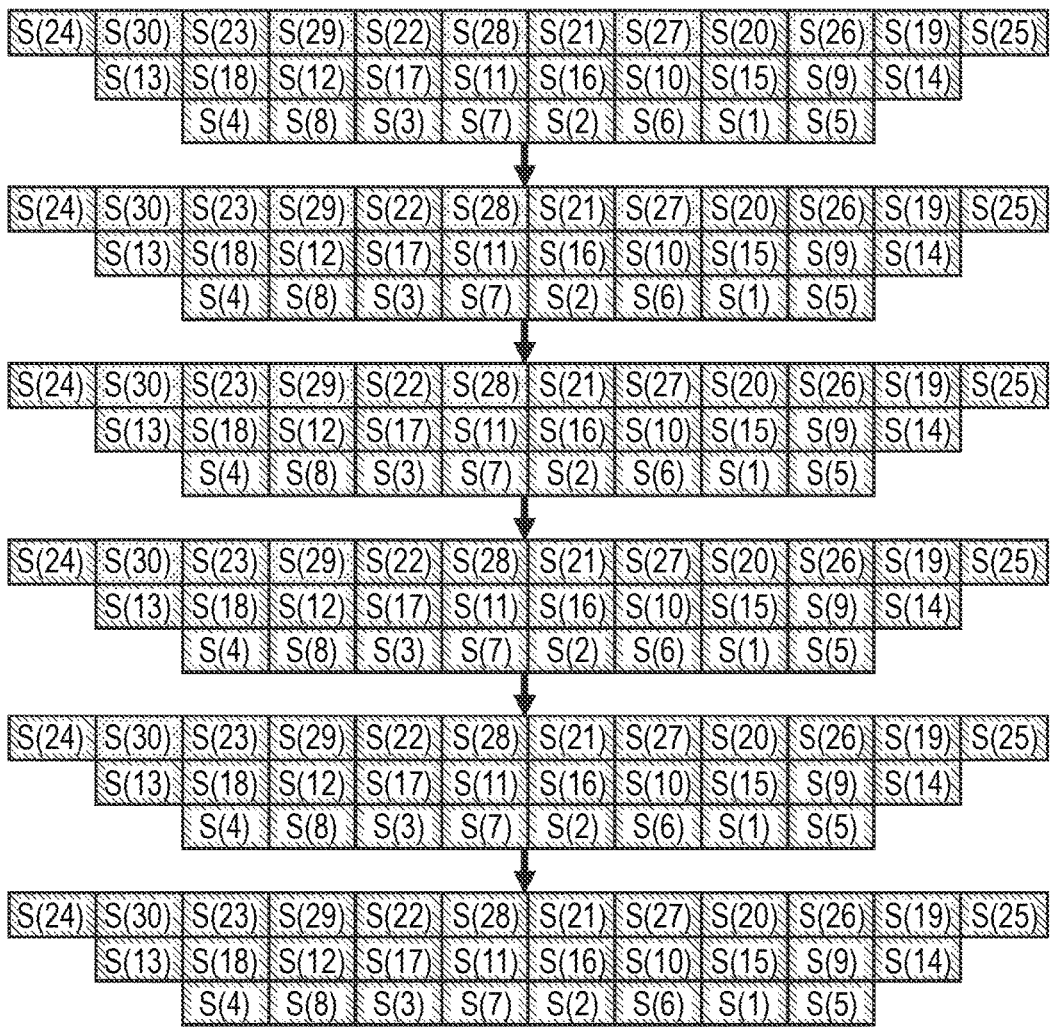
FIGS. 16A and 16B are schematic views illustrating steps of the pattern forming method according to the second embodiment.

Next, as illustrated in FIG. 16(a), the waiting step (M) is performed for $(Td \times m_{max})=6Td$.

Then, as illustrated in FIG. 16(b), the imprinting step is performed on each of the shot areas S(25), S(26), S(27), S(28), S(29) and S(30) included in the shot area group 6 on the substrate 601 in the order in which the layering step (1) is performed.

The flow of the above processing steps for the substrate 601 is shown in Table 3 below. The symbol o in Table 3 represents the waiting step (M) of the required time Td=Ti=T.

TABLE 3

| | Step order | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| | | | Shot area group | | | | | | | | | |
| | | | Shot area group 1 | | | | | | | | | |
| Layering step (1) | S(1) | S(2) | S(3) | S(4) | | | | | | | | |
| Imprinting step (Im) | | | | | | | | | | | | |
| Waiting step (M) | | | | | o | o | o | o | o | o | o | o |

TABLE 3-continued

| | | | | | Step order | | | | | | |
|---|---|---|---|---|---|---|---|---|---|---|---|
| | 13 | 14 | 15 | 16 | 17 | 18 | 19 | 20 | 21 | 22 | 23 | 24 |
| | | | | | | Shot area group | | | | | | |
| | | Shot area group 2 | | | | | | Shot area group 1 | | | | |
| Layering step (1) | S(5) | S(6) | S(7) | S(8) | | | | | | | | |
| Imprinting step (Im) | | | | | | | | S(1) | S(2) | S(3) | S(4) | |
| Waiting step (M) | | | | | O | O | | | | | O | O |

| | | | | | Step order | | | | | | |
|---|---|---|---|---|---|---|---|---|---|---|---|
| | 25 | 26 | 27 | 28 | 29 | 30 | 31 | 32 | 33 | 34 | 35 | 36 |
| | | | | | | Shot area group | | | | | | |
| | | Shot area group 3 | | | | | | Shot area group 2 | | | | |
| Layering step (1) | S(9) | S(10) | S(11) | S(12) | S(13) | | | | | | | |
| Imprinting step (Im) | | | | | | | | S(5) | S(6) | S(7) | S(8) | |
| Waiting step (M) | | | | | | O | | | | | O | O |

| | | | | | Step order | | | | | | |
|---|---|---|---|---|---|---|---|---|---|---|---|
| | 37 | 38 | 39 | 40 | 41 | 42 | 43 | 44 | 45 | 46 | 47 | 48 |
| | | | | | | Shot area group | | | | | | |
| | | Shot area group 4 | | | | | | Shot area group 3 | | | | |
| Layering step (1) | S(14) | S(15) | S(16) | S(17) | S(18) | | | | | | | |
| Imprinting step (Im) | | | | | | | | S(9) | S(10) | S(11) | S(12) | S(13) |
| Waiting step (M) | | | | | | O | | | | | | O |

| | | | | | Step order | | | | | | |
|---|---|---|---|---|---|---|---|---|---|---|---|
| | 49 | 50 | 51 | 52 | 53 | 54 | 55 | 56 | 57 | 58 | 59 | 60 |
| | | | | | | Shot area group | | | | | | |
| | | Shot area group 5 | | | | | | Shot area group 4 | | | | |
| Layering step (1) | S(19) | S(20) | S(21) | S(22) | S(23) | S(24) | | | | | | |
| Imprinting step (Im) | | | | | | | S(14) | S(15) | S(16) | S(17) | S(18) | |
| Waiting step (M) | | | | | | | | | | | | O |

| | | | | | Step order | | | | | | |
|---|---|---|---|---|---|---|---|---|---|---|---|
| | 61 | 62 | 63 | 64 | 65 | 66 | 67 | 68 | 69 | 70 | 71 | 72 |
| | | | | | | Shot area group | | | | | | |
| | | Shot area group 6 | | | | | | Shot area group 5 | | | | |
| Layering step (1) | S(25) | S(26) | S(27) | S(28) | S(29) | S(30) | | | | | | |
| Imprinting step (Im) | | | | | | | S(19) | S(20) | S(21) | S(22) | S(23) | S(24) |
| Waiting step (M) | | | | | | | | | | | | |

| | | | | | Step order | | | | | | |
|---|---|---|---|---|---|---|---|---|---|---|---|
| | 73 | 74 | 75 | 76 | 77 | 78 | 79 | 80 | 81 | 81 | 83 | 84 |
| | | | | | | | | | Shot area group | | | |
| | | | | | | | | | Shot area group 6 | | | |
| Layering step (2) | | | | | | | | | | | | |
| Imprinting step (Im) | | | | | | | | | S(25) | S(26) | S(27) | S(28) | S(29) | S(30) |
| Waiting step (M) | O | O | O | O | O | O | | | | | | |

Note that in the substrate 601 illustrated in FIG. 6 used in the description of the pattern forming methods according to the first and second embodiments, none of the plurality of shot areas included in each shot area group are adjacent to each other (spaced apart). However, the present invention is not limited thereto, and at least two shot areas may be adjacent to each other.

Further, the required time Td for the layering step (1) referred to in the present embodiment is a time from the start of the layering step (1) in a certain shot area to the start of any of the next layering step (1), the imprinting step (Im) and the waiting step (M).

Further, the required time Ti for the imprinting step (Im) referred to in the present embodiment is a time from the start of the imprinting step (Im) in a certain shot area to the start of any of the next layering step (1), the imprinting process (Im) and the waiting step (M).

In the pattern forming methods according to the first and second embodiments, the interval time from the completion of the layering step (1) to the start of the imprinting step (Im) in a certain shot area is desirably sufficient enough for the prespread of curable composition (A1), and specifically, desirably 1.5 seconds or more.

Next, Table 4 below shows the results of Examples 1 to 3 using the pattern forming method according to the present embodiment and Comparative Examples 1 to 4 using the conventional pattern forming method.

TABLE 4

| | Example 1 | Example 2 | Example 3 | Comparative Example 1 | Comparative Example 2 | Comparative Example 3 | Comparative Example 4 |
|---|---|---|---|---|---|---|---|
| Total number of shot areas | | | | 96 | | | |
| $m_{max}$ | 6 | 2 | 12 | 1 | 1 | 6 | 6 |
| Layering step (1) Required time [sec] | 0.800 | 0.800 | 0.800 | 0.800 | 0.800 | 0.800 | 0.800 |
| Waiting step (M) Required time [sec] (Average value per shot area) | 0.100 | 0.0333 | 0.100 | 0 | 1.50 | 0 | 0 |
| Imprinting step (Im) Required time [sec] (Mold contacting step (2)—Light irradiation step (3)—Releasing step (4)) | 0.800 | 0.800 | 0.800 | 1.60 | 1.40 | 1.20 | 0.800 |
| Interval time [sec] obtained | 4.00 | 4.00 | 8.80 | 0 | 1.50 | 2.40~6.00 | 2.40~4.00 |
| One shot cycle [sec] (Average value per shot area) | 1.70 | 1.63 | 1.70 | 2.40 | 3.70 | 2.00 | 1.60 |
| Filling property | Good | Good | Good | Good | Good | Good | Bad |

Figure 17:
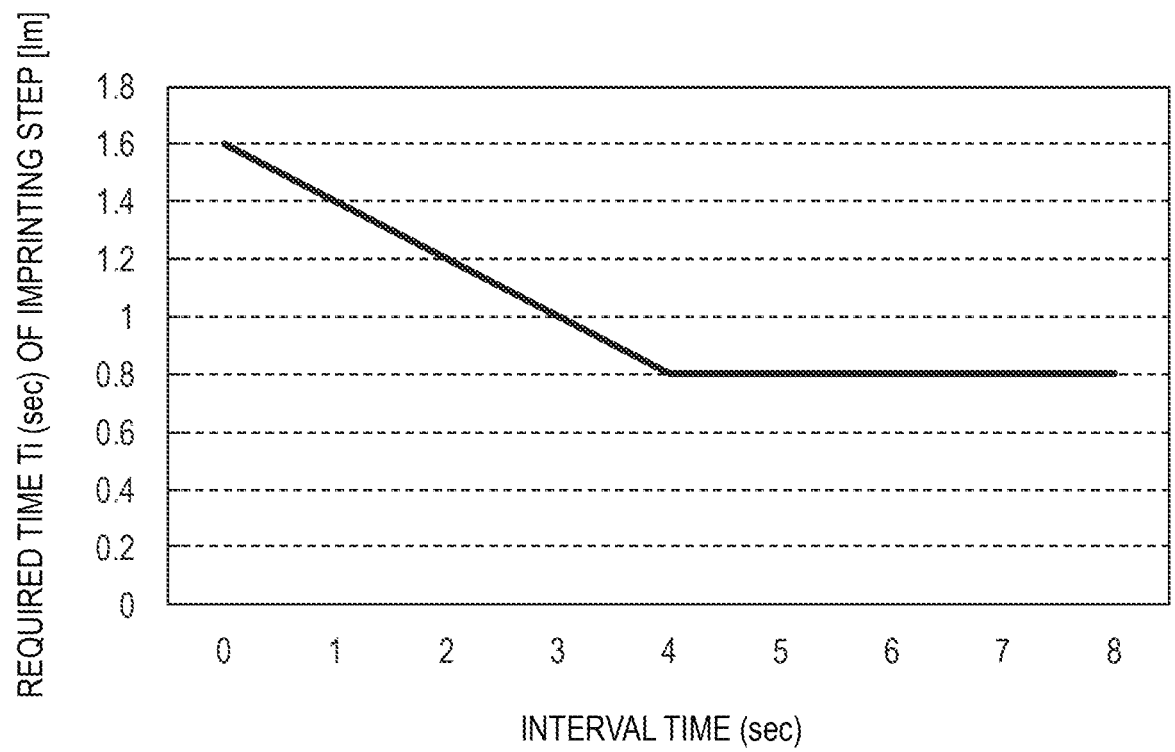
FIG. 17 is a graph illustrating a relationship between a required time for an imprinting step (Im) and an interval time.

The relationship between the required time Ti for the imprinting step (Im) and the interval time is assumed as illustrated in FIG. 17, and the following Examples 1 to 3 and Comparative Examples 1 to 3 are implemented based on this assumption.

Figure 18:
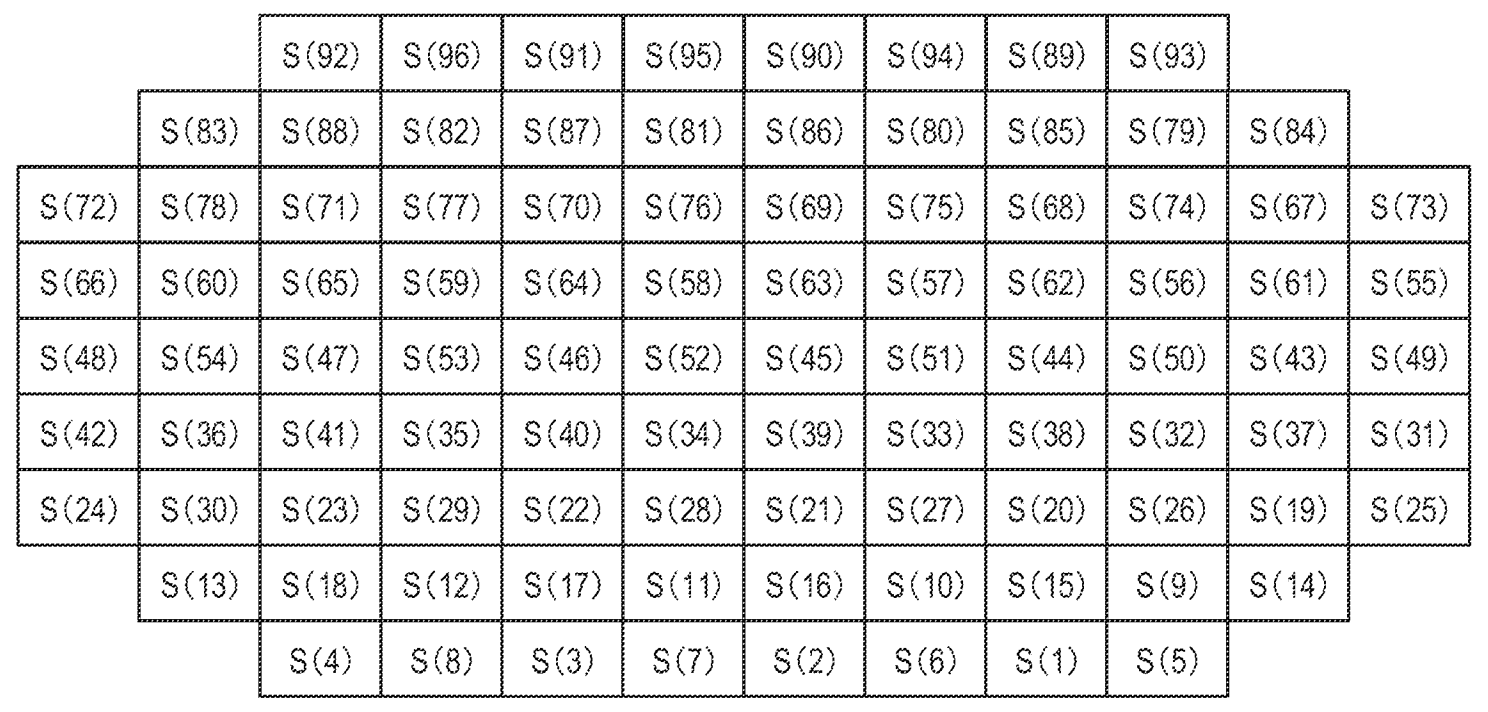

Here, in Example 1, a total of 96 shot areas arranged as illustrated in FIG. 18 are allocated to a total of 18 shot area groups as shown in Table 5 below ($m_{max}$=6), the required time Td for the layering step (1) and the required time Ti for the imprinting step (Im) are set to 0.800 seconds, and the pattern forming is performed according to the pattern forming method according to the first embodiment.

At this time, the average required time for the waiting step (M) per shot area is [(6−4)+(6−4)+(6−5)+(6−5)+(6−5)+(6−5)+(6−4)+(6−4)]×0.800/96=0.100 seconds.

Then, the interval time from the completion of the layering step (1) to the start of the imprinting step (Im) in a certain shot area is (6−1)×0.800=4.00 seconds.

Therefore, the time taken for forming a pattern per shot area (one shot cycle) is 0.800+0.100+0.800=1.70 seconds and completing from the layering step (1) to the imprinting step (Im) for all 96 shot areas takes 163 seconds.

Then, the filling property to the mold of the curable composition (A) in Example 1 is favorable.

TABLE 5

| Shot area group r | Shot area S(v) | Number $m_n$ of shot areas |
|---|---|---|
| Shot area group 1 | S(1), S(2), S(3), S(4) | $m_1 = 4$ |
| Shot area group 2 | S(5), S(6), S(7), S(8) | $m_2 = 4$ |
| Shot area group 3 | S(9), S(10), S(11), S(12), S(13) | $m_3 = 5$ |
| Shot area group 4 | S(14), S(15), S(16), S(17), S(18) | $m_4 = 5$ |

TABLE 5-continued

| Shot area group r | Shot area S(v) | Number $m_n$ of shot areas |
|---|---|---|
| Shot area group 5 | S(19), S(20), S(21), S(22), S(23), S(24) | $m_5 = 6(=m_{max})$ |
| Shot area group 6 | S(25), S(26), S(27), S(28), S(29), S(30) | $m_6 = 6(=m_{max})$ |
| Shot area group 7 | S(31), S(32), S(33), S(34), S(35), S(36) | $m_7 = 6(=m_{max})$ |
| Shot area group 8 | S(37), S(38), S(39), S(40), S(41), S(42) | $m_8 = 6(=m_{max})$ |
| Shot area group 9 | S(43), S(44), S(45), S(46), S(47), S(48) | $m_9 = 6(=m_{max})$ |
| Shot area group 10 | S(49), S(50), S(51), S(52), S(53), S(54) | $m_{10} = 6(=m_{max})$ |
| Shot area group 11 | S(55), S(56), S(57), S(58), S(59), S(60) | $m_{11} = 6(=m_{max})$ |
| Shot area group 12 | S(61), S(62), S(63), S(64), S(65), S(66) | $m_{12} = 6(=m_{max})$ |
| Shot area group 13 | S(67), S(68), S(69), S(70), S(71), S(72) | $m_{13} = 6(=m_{max})$ |
| Shot area group 14 | S(73), S(74), S(75), S(76), S(77), S(78) | $m_{14} = 6(=m_{max})$ |
| Shot area group 15 | S(79), S(80), S(81), S(82), S(83) | $m_{15} = 5$ |
| Shot area group 16 | S(84), S(85), S(86), S(87), S(88) | $m_{16} = 5$ |
| Shot area group 17 | S(89), S(90), S(91), S(92) | $m_{17} = 4$ |
| Shot area group 18 | S(93), S(94), S(95), S(96) | $m_{18} = 4$ |

Figure 19:
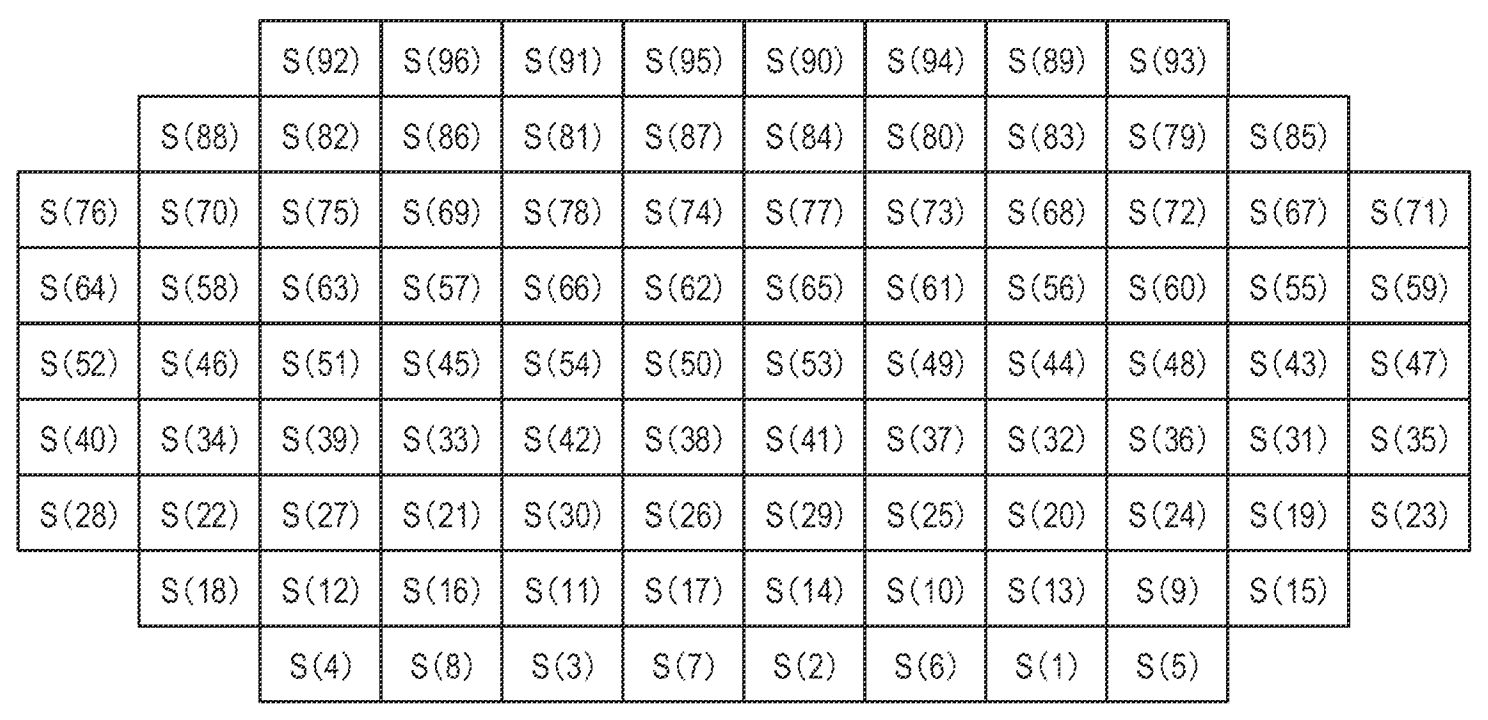

Next, in Example 2, a total of 96 shot areas arranged as illustrated in FIG. 19 are allocated to a total of 48 shot area groups as shown in Table 6 below ($m_{max}=2$), the required time Td for the layering step (1) and the required time Ti for the imprinting step (Im) are set to 0.800 seconds, and the pattern forming is performed according to the pattern forming method according to the second embodiment.

At this time, the average required time for the waiting step (M) per shot area is $[2×0.800+2×0.800]/96=0.0333$ seconds.

Then, the interval time from the completion of the layering step (1) to the start of the imprinting step (Im) in a certain shot area is $(3×2-1)×0.800=4.00$ seconds.

Therefore, the time taken for forming a pattern per one shot area (one shot cycle) is $0.800+0.0333+0.800=1.63$ seconds and completing from the layering step (1) to the imprinting step (Im) for all 96 shot areas takes 156 seconds.

Then, the filling property to the mold of the curable composition (A) in Example 2 is favorable.

TABLE 6

| Shot area group r | Shot area S(v) | Number $m_n$ of shot areas |
|---|---|---|
| Shot area group 1 | S(1), S(2) | $m_n = 2(=m_{max})$ |
| Shot area group 2 | S(3), S(4) | |
| Shot area group 3 | S(5), S(6) | |
| Shot area group 4 | S(7), S(8) | |
| Shot area group 5 | S(9), S(10) | |
| Shot area group 6 | S(11), S(12) | |
| Shot area group 7 | S(13), S(14) | |
| Shot area group 8 | S(15), S(16) | |
| Shot area group 9 | S(17), S(18) | |
| Shot area group 10 | S(19), S(20) | |
| Shot area group 11 | S(21), S(22) | |
| Shot area group 12 | S(23), S(24) | |
| Shot area group 13 | S(25), S(26) | |
| Shot area group 14 | S(27), S(28) | |
| Shot area group 15 | S(29), S(30) | |
| Shot area group 16 | S(31), S(32) | |
| Shot area group 17 | S(33), S(34) | |
| Shot area group 18 | S(35), S(36) | |
| Shot area group 19 | S(37), S(38) | |
| Shot area group 20 | S(39), S(40) | |
| Shot area group 21 | S(41), S(42) | |
| Shot area group 22 | S(43), S(44) | |
| Shot area group 23 | S(45), S(46) | |
| Shot area group 24 | S(47), S(48) | |
| Shot area group 25 | S(49), S(50) | $m_n = 2(=m_{max})$ |
| Shot area group 26 | S(51), S(52) | |
| Shot area group 27 | S(53), S(54) | |
| Shot area group 28 | S(55), S(56) | |
| Shot area group 29 | S(57), S(58) | |
| Shot area group 30 | S(59), S(60) | |
| Shot area group 31 | S(61), S(62) | |
| Shot area group 32 | S(63), S(64) | |
| Shot area group 33 | S(65), S(66) | |
| Shot area group 34 | S(67), S(68) | |
| Shot area group 35 | S(69), S(70) | |
| Shot area group 36 | S(71), S(72) | |
| Shot area group 37 | S(73), S(74) | |
| Shot area group 38 | S(75), S(76) | |
| Shot area group 39 | S(77), S(78) | |
| Shot area group 40 | S(79), S(80) | |
| Shot area group 41 | S(81), S(82) | |
| Shot area group 42 | S(83), S(84) | |
| Shot area group 43 | S(85), S(86) | |
| Shot area group 44 | S(87), S(88) | |
| Shot area group 45 | S(89), S(90) | |
| Shot area group 46 | S(91), S(92) | |
| Shot area group 47 | S(93), S(94) | |
| Shot area group 48 | S(95), S(96) | |

Figure 20:
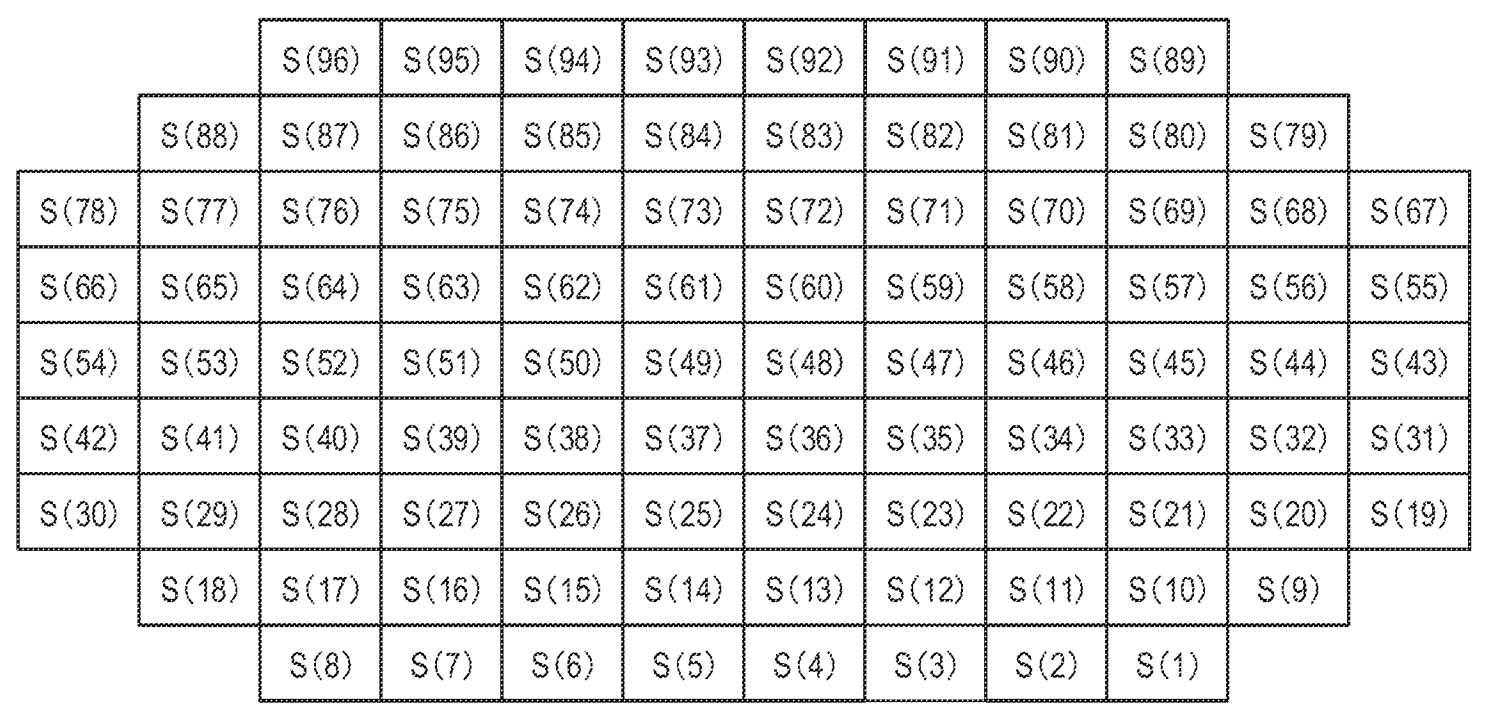

Next, in Example 3, a total of 96 shot areas arranged as illustrated in FIG. 20 are allocated to a total of 9 shot area groups as shown in Table 7 below ($m_{max}=12$), the required time Id for the layering step (1) and the required time Ti for the imprinting step (Im) are set to 0.800 seconds, and the pattern forming is performed according to the pattern forming method according to the first embodiment.

At this time, the required time for the waiting step (M) per shot area is $[(12-8)+(12-10)+(12-10)+(12-8)]×0.800/96=0.100$ seconds.

Then, the interval time from the completion of the layering step (1) to the start of the imprinting step (Im) in a certain shot area is $(12-1)×0.800=8.80$ seconds.

Therefore, the time taken for forming a pattern per shot area (one shot cycle) is $0.800+0.100+0.800=1.700$ seconds and completing from the layering step (1) to the imprinting step (Im) for all 96 shot areas takes 163 seconds.

Then, the filling property to the mold of the curable composition (A) in Example 3 is favorable.

TABLE 7

| Shot area group r | Shot area S(v) | Number $m_n$ of shot areas |
|---|---|---|
| Shot area group 1 | S(1), S(2), S(3), S(4), S(5), S(6), S(7), S(8) | $m_1 = 8$ |
| Shot area group 2 | S(9), S(10), S(11), S(12), S(13), S(14), S(15), S(16), S(17), S(18) | $m_2 = 10$ |
| Shot area group 3 | S(19), S(20), S(21), S(22), S(23), S(24), S(25), S(26), S(27), S(28), S(29), S(30) | $m_3 = 12(=m_{max})$ |
| Shot area group 4 | S(31), S(32), S(33), S(34), S(35), S(36), S(37), S(38), S(39), S(40), S(41), S(42) | $m_4 = 12(=m_{max})$ |
| Shot area group 5 | S(43), S(44), S(45), S(46), S(47), S(48), S(49), S(50), S(51), S(52), S(53), S(54) | $m_5 = 12(=m_{max})$ |
| Shot area group 6 | S(55), S(56), S(57), S(58), S(59), S(60), S(61), S(62), S(63), S(64), S(65), S(66) | $m_6 = 12(=m_{max})$ |
| Shot area group 7 | S(67), S(68), S(69), S(70), S(71), S(72), S(73), S(74), S(75), S(76), S(77), S(78) | $m_7 = 12(=m_{max})$ |
| Shot area group 8 | S(79), S(80), S(81), S(82), S(83), S(84), S(85), S(86), S(87), S(88) | $m_8 = 10$ |
| Shot area group 9 | S(89), S(90), S(91), S(92), S(93), S(94), S(95), S(96) | $m_9 = 8$ |

Next, in Comparative Example 1, with respect to a total of 96 shot areas arranged as illustrated in FIG. 20, the required time Td for the layering step (1) is set to 0.800 seconds and the required time Ti for the imprinting step (Im) is set to 1.60 seconds, and the pattern forming is performed according to a conventional pattern forming method 1 ($m_{max}=1$) as illustrated in FIG. 2.

In the conventional pattern forming method 1, since the waiting step (M) is not provided, the required time for the waiting step (M) per shot area is 0 seconds.

Then, in the conventional pattern forming method 1, since the imprinting step (Im) is started immediately after the completion of the layering step (1) in a certain shot area, the interval time from the completion of the layering step (1) to the start of the imprinting step (Im) in a certain shot area is also 0 seconds.

Therefore, the time taken for forming a pattern per shot area (one shot cycle) is $0.800+0+1.60=2.40$ seconds and completing from the layering step (1) to the imprinting step (Im) for all 96 shot areas takes 230 seconds.

The filling property to the mold of the curable composition (A) in Comparative Example 1 is favorable.

Next, in Comparative Example 2, with respect to a total of 96 shot areas arranged as illustrated in FIG. 20, the required time Td for the layering step (1) is set to 0.800 seconds and the required time Ti for the imprinting step (Im) is set to 1.40 seconds, and the waiting step (M) for a required time of 1.50 seconds is provided between the layering step (1) and the imprinting step (Im) to perform pattern forming in the conventional pattern forming method 1 ($m_{max}$=1) as illustrated in FIG. 2.

Therefore, the required time for the waiting step (M) per shot area is 1.50 seconds.

Then, the interval time from the completion of the layering step (1) to the start of the imprinting step (Im) in a certain shot area is 1.50 seconds as well.

Therefore, the time taken for forming a pattern per shot area (one shot cycle) is 0.800+1.50+1.40=3.70 seconds and completing from the layering step (1) to the imprinting step (Im) for all 96 shot areas takes 355 seconds.

The filling property to the mold of the curable composition (A) in Comparative Example 2 is favorable.

Next, in Comparative Example 3, a total of 96 shot areas arranged as illustrated in FIG. 18 are allocated to a total of 18 shot area groups as shown in Table 5 above ($m_{max}$=6), the required time Td for the layering step (1) is set to 0.800 seconds and the required time Ti for the imprinting step (Im) is set to 1.20 seconds, and the pattern forming is performed according to a conventional pattern forming method 2 as illustrated in FIG. 3.

Therefore, the required time for the waiting step (M) per shot area is 0 seconds.

Then, the interval time from the completion of the layering step (1) to the start of the imprinting step (Im) in a certain shot area is 3Td=2.40 seconds at the minimum and 5Ti=6.00 seconds at the maximum.

Based on the relationship between the required time Ti for the imprinting step (Im) and the interval time as illustrated in FIG. 17, the required time Ti for the imprinting step (Im) in Comparative Example 3 is set to 1.20 seconds at the minimum interval time of 2.40 seconds.

Therefore, the time taken for forming a pattern per shot area (one shot cycle) is 0.800+1.20=2.00 seconds and completing from the layering step (1) to the imprinting step (Im) for all of the 96 shot areas takes 192 seconds.

The filling property to the mold of the curable composition (A) in Comparative Example 3 is favorable.

Next, in Comparative Example 4, a total of 96 shot areas arranged as illustrated in FIG. 18 are allocated to a total of 18 shot area groups as shown in Table 5 above ($m_{max}$=6), the required time Td for the layering step (1) is set to 0.800 seconds and the required time Ti for the imprinting step (Im) is set to 0.800 seconds, and the pattern forming is performed according to the conventional pattern forming method 2 as illustrated in FIG. 3.

Therefore, the required time for the waiting step (M) per shot area is 0 seconds.

Then, the interval time from the completion of the layering step (1) to the start of the imprinting step (Im) in a certain shot area is 3Td=2.40 seconds at the minimum and 5Ti=4.00 seconds at the maximum.

Therefore, the time taken for forming a pattern per shot area (one shot cycle) is 0.800+0.80=1.60 seconds and completing from the layering step (1) to the imprinting step (Im) for all of the 96 shot areas takes 154 seconds.

The filling property to the mold of the curable composition (A) in Comparative Example 4 is not favorable. This is because in the relationship between the required time Ti for the imprinting step (Im) and the interval time as illustrated in FIG. 17, the required time Ti for the imprinting step (Im) in Comparative Example 4 is set to 0.800 seconds, which is shorter than 1.20 seconds corresponding to the minimum interval time of 2.40 seconds, and a filling failure partially occurs due to the insufficient filling time.

As shown in Table 4, in Examples 1 to 3 using the pattern forming method according to the first or second embodiment, the interval time from the completion of the layering step (1) to the start of the imprinting step (Im) in a certain shot area is 4.00 seconds to 8.80 seconds. Therefore, an interval time sufficient for the proceeding of the prespread is obtained from the completion of the layering step (1) to the start of the imprinting step (Im).

In addition to achieving high throughput with a time taken for forming a pattern per shot area (one shot cycle) of 1.63 seconds to 1.70 seconds, favorable patterns are obtained for the total of 96 shot areas, achieving high quality.

On the other hand, in Comparative Examples 1 to 3 using the conventional pattern forming method, it is indicated that the time taken for forming a pattern per shot area (one shot cycle) is as long as 2.00 seconds to 3.70 seconds.

Then, in Comparative Example 4 using the conventional pattern forming method, the time taken for forming a pattern per shot area (one shot cycle) is as short as 1.60 seconds, but the filling property is not favorable.

As described above, by using the pattern forming method according to the present embodiment, a high throughput and high quality photo nanoimprint technology can be provided.

In the pattern forming method according to the present embodiment, the coating film may be formed in advance by layering (applying) the curable composition (A2) on the surface of the substrate.

Here, since the curable composition (A2) is a compound similar to the above-mentioned curable composition (A1) except for the following points, the description of the same configuration will be omitted.

The blending proportion of the component (a2) serving as a polymerizable compound in the curable composition (A2) is desirably 50 wt % or more and 100 wt % or less with respect to the total weight of the component (a2), the component (b2) and the component (c2), that is, the total weight of the components of the curable composition (A2) excluding the component (d2) serving as a solvent. In addition, the blending proportion is preferably 80 wt % or more and 100 wt % or less, and more preferably more than 90 wt % and 100 wt % or less.

Then, when the blending proportion of the component (a2) serving as a polymerizable compound in the curable composition (A2) is set to 50 wt % or more with respect to the total weight of the component (a2), the component (b2), and the component (c2), a cured film to be obtained can be turned into a cured film having some degree of mechanical strength.

In addition, it is preferred that the curable composition (A2) be substantially free of photoreactivity. To this end, it is preferred that the blending proportion of the component (b2) serving as a photopolymerization initiator in the curable composition (A2) be less than 0.1 wt % with respect to the total of the component (a2), the component (b2) and the component (c2), that is, the total weight of all the components excluding the solvent component (d2). In other words, it is preferred that the content of a photopolymerization initiator (b2) of the curable composition (A2) be 0 parts by weight or more and less than 0.1 parts by weight with respect to 100 parts by weight of the polymerizable compound (a2). Further, it is more preferred that the blending proportion of the component (b2) serving as a photopolymerization initiator in the curable composition (A2) be 0.01 wt % or less with respect to the total of the component (a2), the component (b2) and the component (c2), that is, the total weight of all the components excluding the solvent component (d2).

In addition, it is preferred that the curable composition (A2) contains the component (d2), and the component (a2) desirably accounts for 0.01 wt % or more and 10 wt % or less with respect to the total weight of the components of the curable composition (A2) containing the component (d2) serving as a solvent. The component (d2) is not particularly limited as long as the component is a solvent that dissolves the component (a2), the component (b2) and the component (c2). The solvent is preferably a solvent having a boiling point at normal pressure of 80° C. or more and 200° C. or less. The solvent is more preferably a solvent having at least one of an ester structure, a ketone structure, a hydroxyl group or an ether structure. The solvent is specifically a single solvent selected from the group consisting of propylene glycol monomethyl ether acetate, propylene glycol monomethyl ether, cyclohexanone, 2-heptanone, γ-butyrolactone and ethyl lactate, or a mixed solvent thereof.

The viscosity at 25° C. of a mixture of the components of the curable composition (A2) excluding the component (d2) serving as a solvent is preferably 20 mPa·s or more and 10000 mPa·s or less. In addition, the viscosity is more preferably 20 mPa·s or more and 1000 mPa·s or less.

The surface tension of the curable composition (A2) excluding the component (d2) serving as a solvent is preferably higher than the surface tension of the curable composition (A1) excluding the component (d1) serving as a solvent. This is because of the following reason. Before the mold contacting step, the prespread of the curable composition (A1) is accelerated (droplets spread over a wide range) by the Marangoni effect to be described later, and hence a time required for spreading in the mold contacting step is shortened. As a result, a filling time is shortened.

The Marangoni effect is a phenomenon of free surface movement caused by a local difference in the surface tension of liquid (N. Imaishi/Int. J. Microgravity Sci. No. 31 Supplement 2014 (S5-S12)). The difference in surface tension, in other words, surface energy serves as a driving force to cause diffusion such that a liquid having a low surface tension covers a wider surface. In other words, when the curable composition (A2) having a high surface tension is applied to the entire surface of the substrate and the curable composition (A1) having a low surface tension is dropped, the prespread of the curable composition (A1) is accelerated.

At this time, as a method of arranging the curable composition (A2) on a surface of the substrate, for example, an ink jet method, a dip coating method, an air knife coating method, a curtain coating method, a wire bar coating method, a gravure coating method, an extrusion coating method, a spin coating method or a slit scan method can be used. In particular, a spin coating method is preferred.

When the curable composition (A2) is arranged on a surface of the substrate using the spin coating method, the component (d2) serving as a solvent may be volatilized by performing a baking step as necessary.

The average thickness of the film of the curable composition (A2), which varies depending on applications where the cured film is used, is, for example, 0.1 nm or more and 10,000 nm or less, preferably 1 nm or more and 20 nm or less, and particularly preferably 1 nm or more and 10 nm or less.

[Method of Manufacturing Semiconductor Element, Electronic Component and Optical Device]

By using, as a mask, the cured film 106 having a pattern shape, for example, as illustrated in FIG. 1, obtained by the pattern forming method according to the present embodiment, the substrate 101 (layer to be processed in a case where the substrate 101 has a layer to be processed) can be processed into a pattern using processing measures such as etching.

The pattern transfer may be performed using processing measures such as etching after the layer to be processed is further formed on the cured film 106 having a pattern shape.

In this manner, a circuit structure based on the pattern shape of the cured film 106 having a pattern shape can be formed on the substrate 101.

Thus, a semiconductor element can be manufactured. In addition, an electronic device, such as a display, a camera or a medical apparatus, can be formed by connecting the semiconductor element and, for example, a circuit control mechanism for a semiconductor element.

Examples of the semiconductor element as used herein include an LSI, a system LSI, a DRAM, an SDRAM, an RDRAM, a D-RDRAM and a NAND flash.

An optical component can also be obtained by utilizing the cured film 106 having a pattern shape obtained by the pattern forming method according to the present embodiment, as an optical member such as a diffraction grating or a polarizing plate (the case where the film is used as one member of the optical members is included).

In such a case, an optical component having at least the substrate 101 and the cured film 106 having a pattern shape on the substrate 101 can be obtained.

Although preferred embodiments have been described in detail with reference to the drawings as appropriate, the present invention is not limited to these embodiments, and based on the ordinary knowledge of those skilled in the art without departing from the scope of the present invention, appropriate changes or modifications may be made to these embodiments.

According to the present invention, a pattern forming method which achieves higher throughput can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-150192, filed Aug. 9, 2018, which is hereby incorporated by reference herein in its entirety.

What is claimed is:

1. A method of forming a pattern in a plurality of shot areas included in a plurality of shot area groups on a substrate, the method comprising, for each shot area group of the plurality of shot area groups, in the following order:
    discretely dropping droplets of a curable composition (A1) containing at least a component (a1) serving as a polymerizable compound to layer the droplets on a plurality of shot areas included in a certain shot area group of the plurality of shot area groups on the substrate;
    waiting for a time of $(m_{max}-m) \times Td$, where Td is a time for the dropping on one shot area, m is the number of shot areas included in the certain shot area group, and $m_{max}$ is the maximum value of the number of shot areas included in a shot area group among the plurality of shot area groups; and
    in an order in which the dropping is performed on the plurality of shot areas included in the certain shot area group, imprinting which includes:
        bringing the curable composition (A1) into contact with a mold;

irradiating the curable composition (A1) with light from a side of the mold to cure the curable composition (A1); and separating the mold from the cured product of the curable composition (A1);

wherein the time Td and a time Ti for the imprinting on one shot area are equal to each other, each shot area group of the plurality of shot area groups does not include shot areas included in another shot area group of the plurality of shot area groups, the number of shot areas included in at least one shot area group is different from the number of shot areas included in another at least one shot area group, and in the waiting step, the dropping and the imprinting are not performed.

2. A method of forming a pattern in a plurality of shot areas included in r shot area groups on a substrate where r is 2 or more, each shot area group of the r shot area groups does not include shot areas included in another shot area group of the r shot area groups, the method comprising, in the following order:

discretely dropping droplets of a curable composition (A1) containing at least a component (a1) serving as a polymerizable compound to layer the droplets on a first plurality of shot areas included in a first shot area group of the r shot area groups on the substrate;

waiting for a time of $(m_{max}-m_1) \times Td$, where Td is a time for the dropping on one shot area, $m_1$ is the number of shot areas included in the first shot area group, and $m_{max}$ is the maximum value of the number of shot areas included in a shot area group among the r shot area groups; and waiting for a time of $m_{max} \times Ti$, where Ti is a time for imprinting on one shot area, the imprinting including:

bringing the curable composition (A1) into contact with a mold;

irradiating the curable composition (A1) with light from a side of the mold to cure the curable composition (A1); and separating the mold from the cured product of the curable composition (A1);

the method further comprising, in the following order with k from 2 to r in order:

discretely dropping droplets of the curable composition (A1) containing at least the component (a1) serving as the polymerizable compound to layer the droplets on a k-th plurality of shot areas included in a k-th shot area group on the substrate;

waiting for a time of $(m_{max}-m_k) \times Td$, where $m_k$ is the number of shot areas included in the k-th shot area group;

imprinting, in an order in which the dropping is performed on a (k−1)-th plurality of shot areas included in a (k−1)-th shot area group, the (k−1)-th plurality of shot areas included in the (k−1)-th shot area group; and waiting for a time of $(m_{max}-m_{k-1}) \times Ti$;

the method further comprising, in the following order:

waiting for a time of $m_{max} \times Td$; and imprinting, in an order in which the dropping is performed on an r-th plurality of shot areas included in an r-th shot area group, the r-th plurality of shot areas included in the r-th shot area group;

wherein the time Td and the time Ti are equal to each other, and in the waiting steps, dropping and imprinting are not performed.

3. The method according to claim 1, wherein the plurality of shot areas included in each shot area group are spaced apart from each other.

4. The method according to claim 2, wherein the plurality of shot areas included in each shot area group are spaced apart from each other.

5. The method according to claim 1, wherein at least two shot areas of the plurality of shot areas are adjacent to each other.

6. The method according to claim 2, wherein at least two shot areas of the plurality of shot areas are adjacent to each other.

7. The method according to claim 1, wherein in each shot area, a time from completion of the dropping to start of the imprinting is 1.5 seconds or more.

8. The method according to claim 2, wherein in each shot area of the k-th plurality of shot areas included in the k-th shot area group, a time from completion of the dropping to start of the imprinting is 1.5 seconds or more.

9. The method according to claim 1, wherein the substrate is a substrate having a surface on which a layer formed of a curable composition (A2) containing at least a polymerizable compound (a2) is layered.

10. The method according to claim 2, wherein the substrate is a substrate having a surface on which a layer formed of a curable composition (A2) containing at least a polymerizable compound (a2) is layered.

11. The method according to claim 9, wherein a content of a photopolymerization initiator (b2) of the curable composition (A2) is 0 parts by weight or more and less than 0.1 parts by weight with respect to 100 parts by weight of the polymerizable compound (a2).

12. The method according to claim 10, wherein a content of a photopolymerization initiator (b2) of the curable composition (A2) is 0 parts by weight or more and less than 0.1 parts by weight with respect to 100 parts by weight of the polymerizable compound (a2).

13. The method according to claim 9, wherein a surface tension of the curable composition (A2) excluding a solvent is larger than a surface tension of the curable composition (A1) excluding a solvent.

14. The method according to claim 10, wherein a surface tension of the curable composition (A2) excluding a solvent is larger than a surface tension of the curable composition (A1) excluding a solvent.

15. The method according to claim 9, wherein a viscosity at 25° C. of the curable composition (A2) is 20 mPa·s or more and 10000 mPa·s or less.

16. The method according to claim 10, wherein a viscosity at 25° C. of the curable composition (A2) is 20 mPa·s or more and 10000 mPa·s or less.

17. The method according to claim 1, wherein a viscosity at 25° C. of the curable composition (A1) excluding a solvent is 1 mPa·s or more and less than 40 mPa·s.

18. The method according to claim 2, wherein a viscosity at 25° C. of the curable composition (A1) excluding a solvent is 1 mPa·s or more and less than 40 mPa·s.

19. A method of manufacturing a semiconductor element, the method comprising:

obtaining a film having a predetermined pattern shape by a pattern forming method according to claim 1; and processing the substrate using the pattern shape of the film as a mask.

20. A method of manufacturing a semiconductor element, the method comprising:

obtaining a film having a predetermined pattern shape by a pattern forming method according to claim 2; and processing the substrate using the pattern shape of the film as a mask.

21. A method of manufacturing an electronic device, the method comprising:
obtaining a semiconductor element by a method of manufacturing a semiconductor element according to claim 19; and
connecting the semiconductor element and a control mechanism that controls the semiconductor element.

22. A method of manufacturing an electronic device, the method comprising:
obtaining a semiconductor element by a method of manufacturing a semiconductor element according to claim 20; and
connecting the semiconductor element and a control mechanism that controls the semiconductor element.

23. A method of manufacturing an optical component, the method comprising:
obtaining a film having a predetermined pattern shape by a pattern forming method according to claim 1.

24. A method of manufacturing an optical component, the method comprising:
obtaining a film having a predetermined pattern shape by a pattern forming method according to claim 2.

* * * * *